United States Patent [19]
Morgan

[11] Patent Number: 5,883,827
[45] Date of Patent: Mar. 16, 1999

[54] METHOD AND APPARATUS FOR READING/WRITING DATA IN A MEMORY SYSTEM INCLUDING PROGRAMMABLE RESISTORS

[75] Inventor: Donald M. Morgan, Boise, Id.

[73] Assignee: Micron Technology, Inc., Boise, Id.

[21] Appl. No.: 704,953

[22] Filed: Aug. 26, 1996

[51] Int. Cl.$^6$ .................................................. G11C 17/00
[52] U.S. Cl. ...................... 365/100; 365/63; 365/189.07
[58] Field of Search ........................... 365/100, 63, 148, 365/189.06, 189.07, 189.09

[56] References Cited

U.S. PATENT DOCUMENTS

| | | | |
|---|---|---|---|
| 3,467,945 | 9/1969 | Myers | 365/148 |
| 3,761,896 | 9/1973 | Davidson | 365/148 |
| 4,014,008 | 3/1977 | Groeger et al. | 365/100 |
| 4,272,833 | 6/1981 | Taylor | 365/163 |
| 5,093,806 | 3/1992 | Tran | 365/189.06 |

FOREIGN PATENT DOCUMENTS 63-0285796  11/1988  Japan .

*Primary Examiner*—Son T. Dinh
*Attorney, Agent, or Firm*—Dickstein Shapiro Morin & Oshinsky LLP

[57] ABSTRACT

The present invention relates to circuitry and a related method to reliably write data to an array of programmable resistance elements by selectively applying pulses of a sufficient level to impart either a first (high) or second (low) resistance state to selected programmable resistance elements to store either a binary "1" or "0", respectively. Data is then read from the array by supplying currents though the selected programmable resistance element and a fixed resistive element. A comparison of the resulting voltages on nodes coupled to these resistive elements will indicate whether the resistance value of the programmable resistance element is at a high or low state, i.e., a binary "1" or "0". Further, a shunt circuit is coupled to the selected column lines of the array to protect the programmable resistance elements from excessive spurious or noise currents, which can erroneously program the programmable resistance elements.

92 Claims, 13 Drawing Sheets

METHOD AND APPARATUS FOR READING/WRITING DATA IN A MEMORY SYSTEM INCLUDING PROGRAMMABLE RESISTORS

This invention was made with Government support under Contract No. MDA972-92-C-0054 awarded by the Advanced Research Projects Agency (ARPA). The Government has certain rights in this invention.

The present invention relates to a memory device, and in particular a memory device including an array of memory cells, each including a programmable resistor.

BACKGROUND OF THE INVENTION

DRAM integrated circuit arrays have existed for more than twenty five years and have evolved from the earliest one kilobit (Kb) generation to the recent 256 megabit (Mb) generation. This dramatic increase in storage capacity has been achieved through advances in semiconductor fabrication technology and circuit design technology. The tremendous advances in these two technologies have also achieved higher and higher levels of integration that permit dramatic reductions in memory array size and cost, as well as increased process yield.

A DRAM memory cell typically comprises, as basic components, an access transistor (switch) and a capacitor for storing a binary data bit in the form of a charge. Typically, a charge of one polarity is stored on the capacitor to represent a binary ONE, and a stored charge of the opposite polarity represents a binary ZERO. The basic drawback of a DRAM is that the charge on the capacitor eventually leaks away and therefore provisions must be made to "refresh" the capacitor charge or else the data bit stored by the memory cell is lost.

The memory cell of a conventional SRAM, on the other hand, comprises, as basic components, an access transistor or transistors and a memory element in the form of two or more integrated circuit devices interconnected to function as a bistable latch. An example of such a bistable latch is cross-coupled inverters. Bistable latches do not need to be "refreshed", as in the case of DRAM memory cells, and will reliably store a data bit indefinitely as long as they continue to receive supply voltage.

Efforts continue to identify other forms of memory elements for use in SRAMs. Recent studies have focused on resistive materials that can be programmed to exhibit either high or low stable ohmic states. A programmable resistance element of such material could be programmed (set) to a high resistive state to store, for example, a ONE data bit or programmed to a low resistive state to store a ZERO data bit. The stored data bit could then be retrieved by detecting the magnitude of a readout current switched through the resistive memory element by an access device, thus indicating the stable resistance state it had previously been programmed to.

One particularly promising programmable, bistable resistive material is chalcogenide, such as the alloy system including Ge:Sb:Te disclosed in Ovshinsky et al., U.S. Pat. No. 5,414,271, the disclosure of which is incorporated herein by reference. A memory element comprised of a chalcogenide material can be programmed to a stable high resistive state by passing a narrow, high amplitude current pulse through it. A lower amplitude current pulse of longer duration programs a chalcogenide memory element to a stable, low resistive state. A chalcogenide memory element is simply written over by the appropriate current pulse to reprogram it, and thus does not need to be erased. Moreover, a memory element of chalcogenide material is nonvolatile, in that it need not be connected to a power supply to retain its programmed high or low resistive state.

However, suitable circuitry for reading and writing data from an array of chalcogenide resistance elements has not yet been fully developed. Accordingly, in order to realize a functional chalcogenide memory, appropriate read circuitry is required to nondestructively sense data stored in the array, and write circuitry is required to accurately write data into the array.

Further, spurious or noise currents may flow in conductive lines within the memory array. These currents can then flow through the chalcogenide memory elements and program erroneous bits into the array.

SUMMARY OF THE INVENTION

Advantages achieved by the invention will be set forth in part in the description which follows, and in part will be obvious from the description, or may be learned by practice of the invention. The advantages of the invention will be realized and attained by means of the elements and combinations particularly pointed out in the appended claims.

In accordance with the present invention, a memory system is provided including an array of programmable resistance elements, each of which being programmable to one of a first resistance value and a second resistance value different than said first resistance value. In addition, a comparison circuit is coupled to the array of programmable resistance elements, for comparing a sense current flowing through a selected one of said programmable resistance elements and a reference current, and to generate a signal in response to the comparison. The signal value represents one of the first and second resistance values to which the resistance element has been programmed.

In addition, in accordance with the present invention, a semiconductor memory device is provided which comprises an array of programmable resistance elements arranged in a plurality of rows and columns. Each of the programmable resistance elements includes a resistor, which is programmable to one of a first resistance value and a second resistance value. A plurality of column lines are respectively coupled to the pluralities of programmable resistance elements arranged in the columns, and a column output line is coupled to each of the column lines. A shunt protection circuit is further provided for limiting voltage and current experienced by memory elements during read operations.

Further, in accordance with the present invention, a method of operating a memory device is provided comprising the steps of: driving one of a plurality of column lines to a first potential in accordance with an output of a column decoder, thereby selecting the one column line; driving one of a plurality of row lines to a second potential in accordance with an output of a row decoder, thereby selecting the one row line; supplying a sense current though a programmable resistance element coupled to the selected one column and one row lines; and comparing the sense current with a reference current, to determine a resistance of the programmable resistance element.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

The present invention relates to circuitry and a related method to reliably write data to an array of programmable resistance memory cells by selectively applying pulses of appropriate levels to impart either a first (high) or second (low) resistance state to a selected programmable resistor within the memory cell, in order to store, for example, either a binary "1" or "0", respectively. Data is then read from the array by supplying currents though the selected programmable resistance element and a fixed resistor. A comparison of the resulting voltages on nodes coupled to these resistive elements will indicate whether the resistance value of the programmable resistance element is at a high or low resistive state. This is then interpreted as a binary "1" or "0". Accordingly, data can then be reliably read from the array as well.

Further, a shunt circuit is coupled to each of the column lines of the array to protect the programmable resistance elements from excessive spurious or noise currents, which can erroneously program the chalcogenide material.

Figure 1:
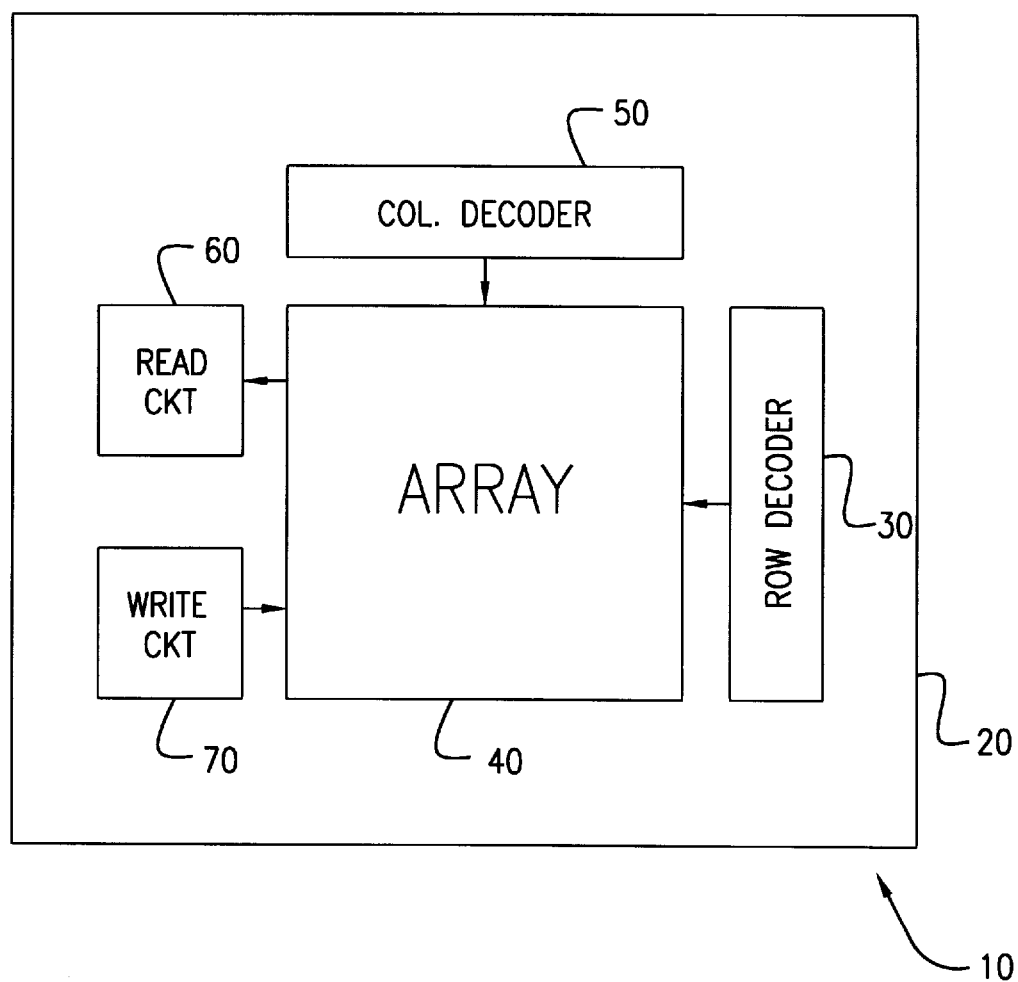
FIG. 1 is a block diagram of a memory system in accordance with the present invention.

FIG. 1 illustrates a block diagram of a memory system 10 in accordance with a preferred embodiment of the present invention. Memory system 10 includes an array 40 of memory cells provided on a semiconductor substrate 20. Column decoder 50 and row decoder 30 are also provided on substrate 20 for selecting a particular row and column within array 40 to designate a single programmable resistance element. Once designated or selected, data can either be read from or programmed into the programmable resistance element using read or comparison circuit 60 and write circuit 70, respectively.

Figure 2:
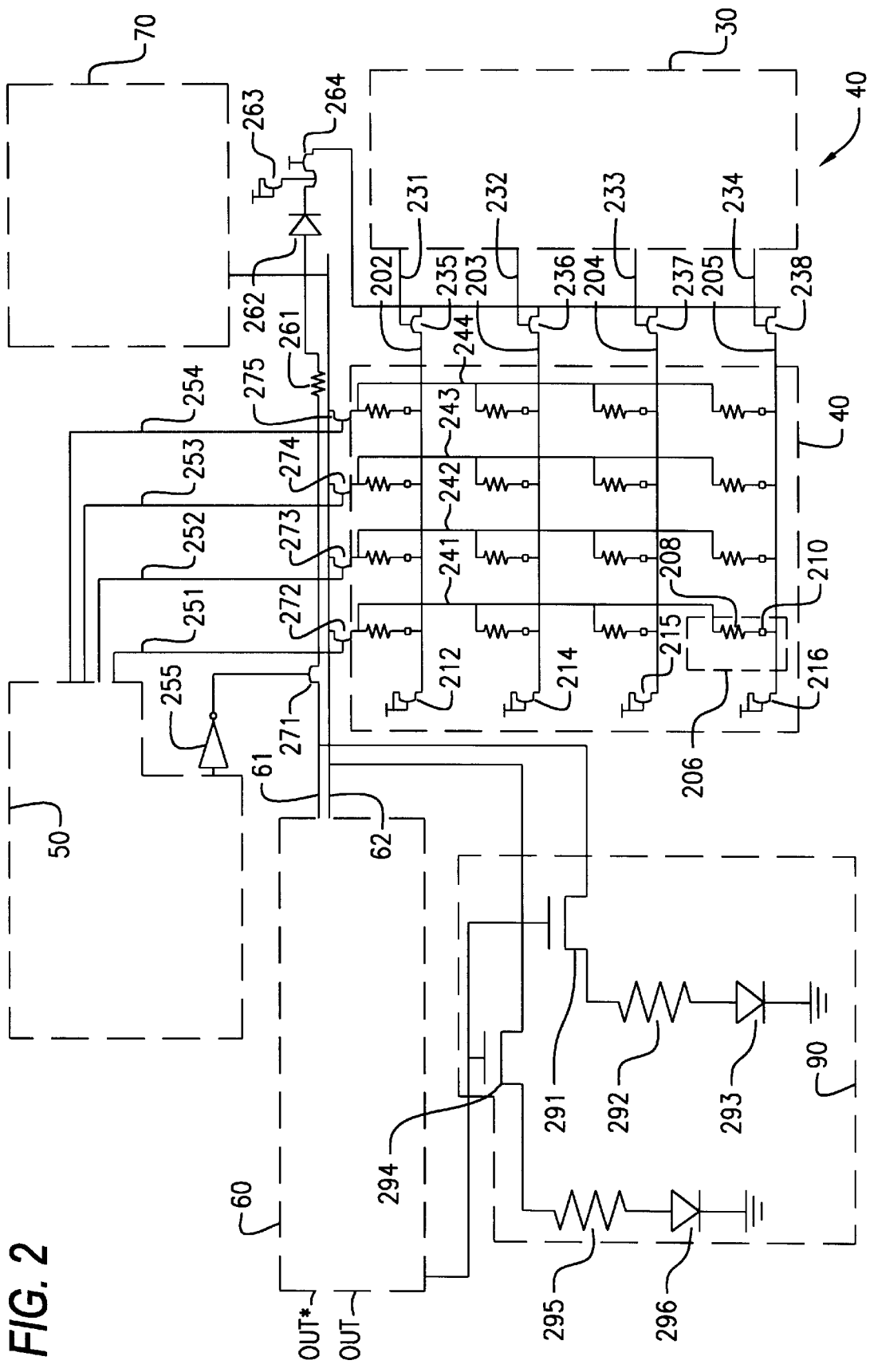
FIG. 2 is a detailed schematic of the memory system shown in FIG. 1.

FIG. 2 is a detailed schematic of array 40. For simplicity, a 4×4 array of memory cells (one indicated at 206) is shown. It should be appreciated that much higher capacity memories are contemplated by the present invention.

As shown in FIG. 2, each memory cell is coupled to one of column lines 241 to 244 and to one of row lies 202 to 205. For example, memory cell 206 includes a programmable resistor 208, preferably including a chalcogenide material, and having a first terminal connected to column line 241 and a second terminal coupled through a potential barrier device or diode 210 to row line 205. Each of column lines 241 to 244 are coupled to a first comparison circuit input line 62 through respective first pass transistors 272 to 275, the gates of which are respectively connected to outputs 251 to 254 of column decoder 50.

Figure 3:
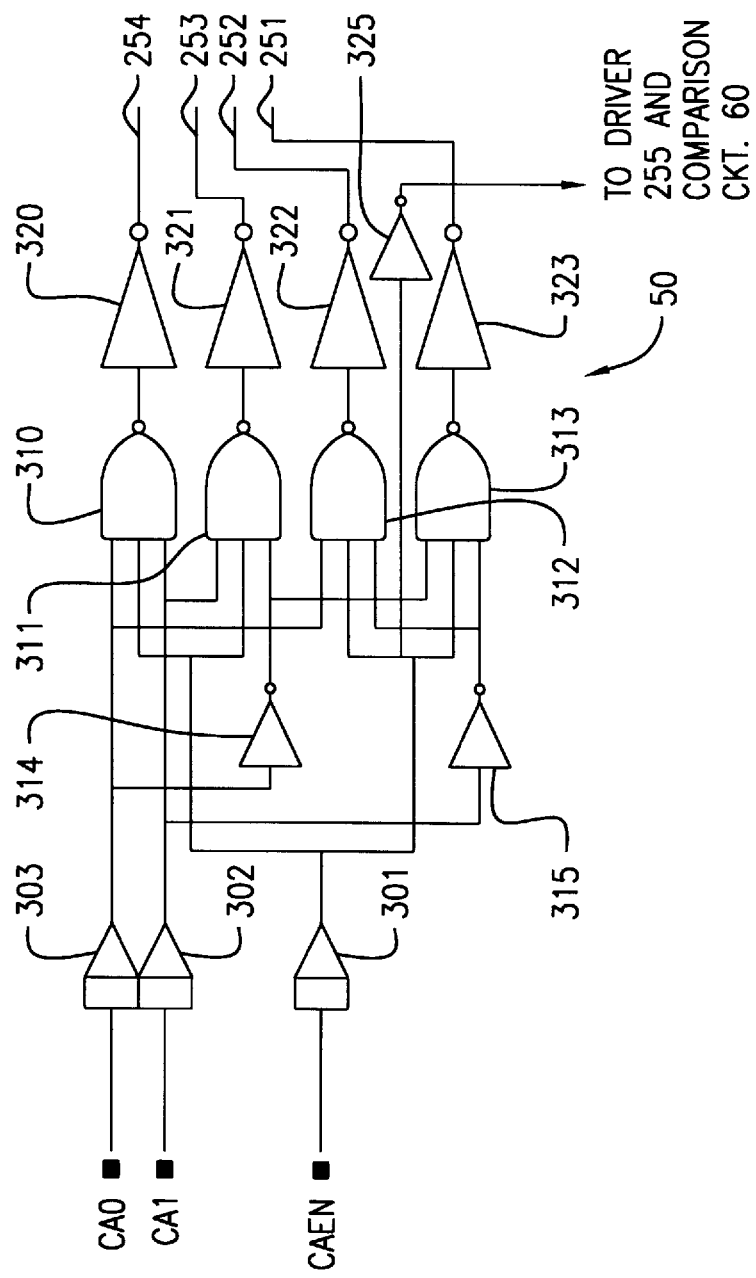
FIG. 3 is a detailed schematic of a column decoder in accordance with the present invention and included in the memory system of FIG. 2.

Column decoder 50 is shown in greater detail in FIG. 3. There it is seen that column decoder 50, in this example, receives two column address bits, CA0 and CA1 and a column address enable signal CAEN. These signals are respectively applied to buffer circuits 301 to 303, which provide appropriate voltage translation of the signal inputs (e.g., TTL to CMOS). The output of buffer circuit 303 (receiving CA0) is supplied directly to the input of NAND gate 310 and 312, while the output of buffer circuit 302 (receiving CA1) is supplied directly to the inputs of NAND gate 310 and 311. The output of buffer circuit 303 is also supplied to inverter 314, which, in turn, generates an inverted output to NAND gates 311 and 313. As further shown in FIG. 3, the output of buffer circuit 302 is supplied to inverter 315, having an output connected to the inputs of NAND gates 312 and 313. Each of NAND gates 310 to 313 further receives the non-inverted output of buffer 301 (receiving CAEN). The output of buffer circuit 301 is also supplied to inverter 325, which outputs to driver 255 and comparison circuit 60 (see FIG. 2).

The outputs of NAND gates 310 to 313 are respectively coupled to the inputs of inverter driver circuits 320 to 323, having outputs respectively connected to column decoder outputs 251 to 254. Thus, when CAEN goes high, one of NAND gates 310 to 313 outputs a low signal in response to a particular column address designated by CA0 and CA1. The low signal is then inverted and driven to a high voltage by a corresponding one of driver circuits 320 to 323 so that only one of column decoder output lines 251 to 254 goes high to select a particular column. Preferably, driver circuit 255 is identical to each of driver circuits 320 to 323.

Driver circuits 320 to 323 preferably output voltages to respective first pass transistors 272 to 275 that are elevated at least one n-channel MOS threshold voltage ($V_T$) above power supply Vcc. Accordingly, the turn-on gate voltage on first pass transistors 272 to 275 will be high enough so that there will be essentially no threshold voltage drop across any of these transistors.

Figure 4:
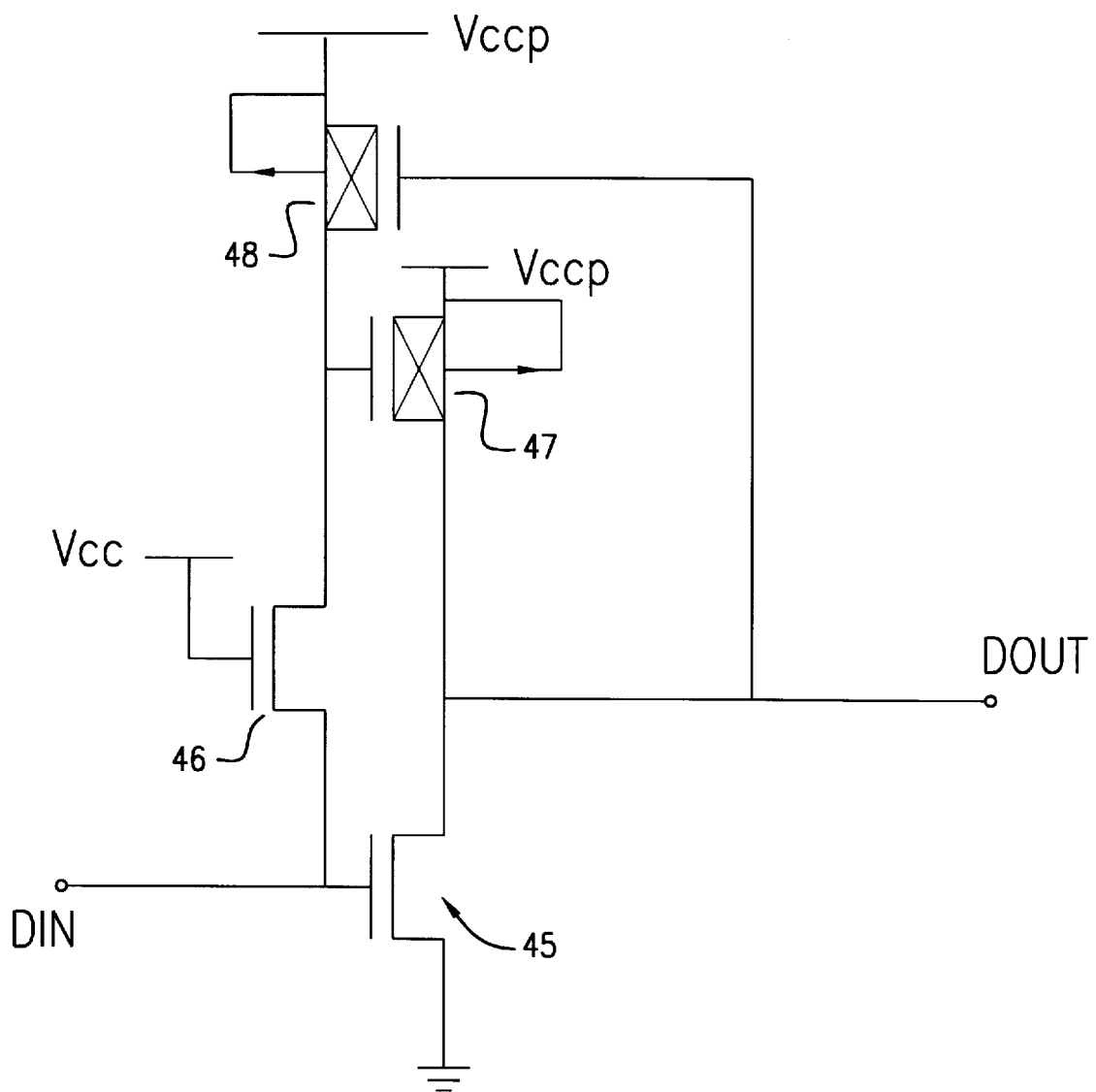
FIG. 4 is a detailed schematic of a voltage translating driver circuit in accordance with the present invention.

The structure of one of driver circuits 255 and 320 to 323 is shown in FIG. 4. Each driver includes an input node DIN connected to the gate of an n-channel MOS transistor 45. The source of transistor 45 is connected to ground and the drain is connected to output node DOUT and to the drain of p-channel MOS transistor 47. MOS 47 transistor has its substrate and source tied to Vccp; a voltage that is preferably at least one $V_T$ above power supply voltage Vcc. An additional p-channel MOS transistor 48 is provided having its source and substrate connected to Vccp, and its gate connected to output node DOUT. The drain of transistor 48 and the gate of transistor 47 are coupled through conductive n-channel MOS transistor 46 to input node DIN.

In operation, when the DIN voltage is low, transistor 45 is cut off, while transistor 47 is rendered conductive. As a result, DOUT is pulled up to Vccp by transistor 47. Since DOUT is high, transistor 48 is also cut off so that the gate of transistor 47 remains low and transistor 47 continues to conduct. When the DIN voltage is high, however, transistor 45 is turned on, thereby pulling down output node voltage DOUT. Transistor 48 is therefore also turned on to supply Vccp to the gate of transistor 47, thereby insuring that transistor 47 is cut off and does not supply Vccp to output node DOUT.

Returning to FIG. 2, the programmable resistor 208 within each memory cell 206 along a column line is coupled to a respective one of row lines 202 to 205 through a respective potential barrier device. For example, programmable resistor 208 has a second terminal coupled to row line 205 through a potential barrier device, in this case diode 210. Each row line is respectively coupled to the sources of transistors 212, 214, 215 and 216, which serve to bias each row line, when not grounded (as discussed below), to approximately Vcc. This ensures that each potential barrier device remains reverse biased so that no current flows through the programmable resistor. Further, the row lines are coupled to ground through respective second pass transistors 235 to 238, the gates of which are respectively connected to row decoder outputs 231 to 234.

Figure 12:
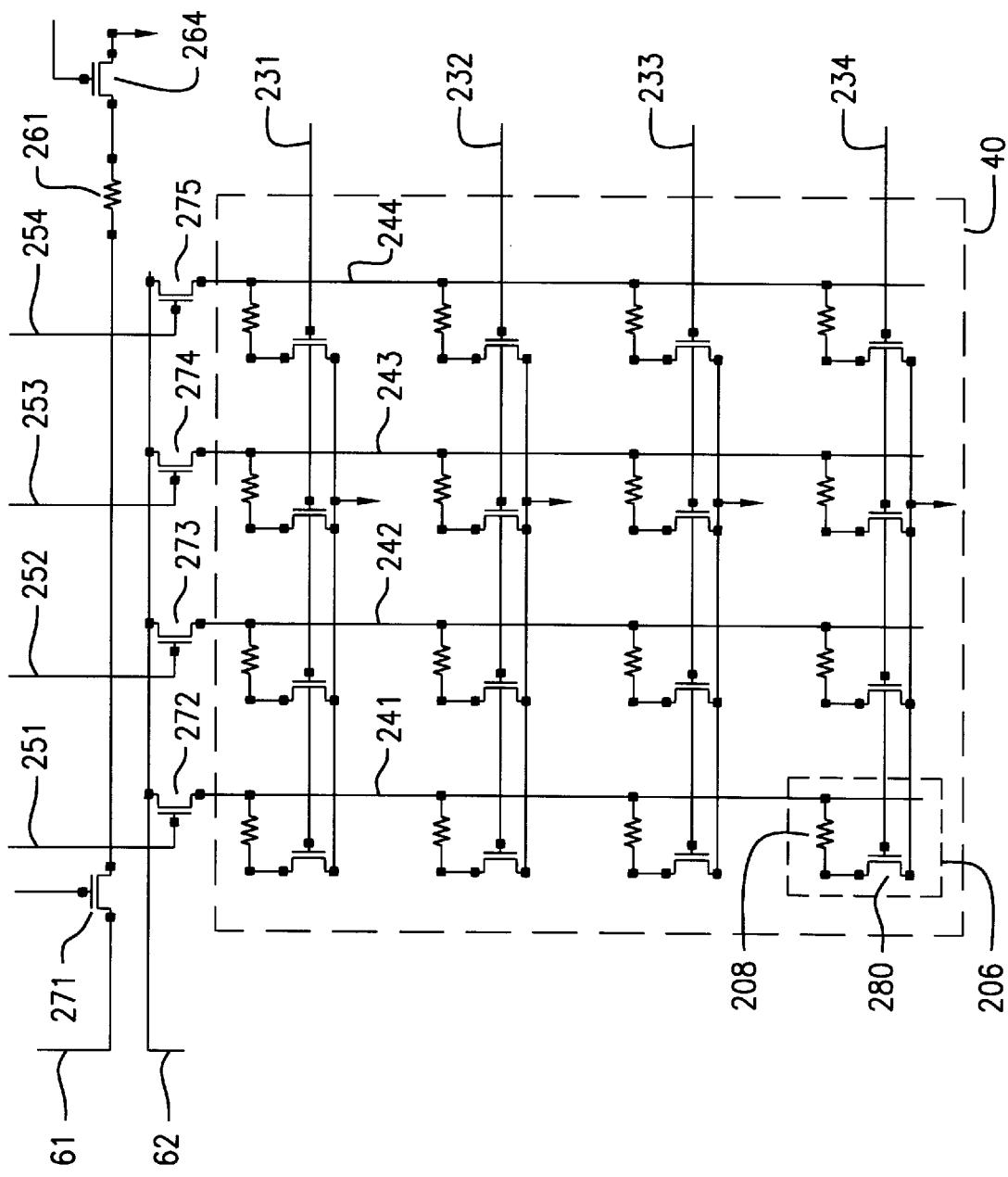
FIG. 12 illustrates a memory array in accordance with a further embodiment of the present invention.

Alternatively, as shown in FIG. 12, second pass transistors 235 to 238 can be replaced by isolation transistors respectively coupled to each programmable resistor in array 40. For example, isolation transistor 280 in memory cell 206 has a drain electrode coupled to column line 241 through programmable resistor 208 and a source electrode coupled in common to the source electrodes of other isolation transistors in the row and to ground. Further, row decoder output line 234 is coupled to the gate of transistor 280. Accordingly, in order to select memory cell 206, a high potential is output from row decoder on line 234 and column line 241 is selected by application of a high potential on that line as well. As a result, isolation transistor 280 is turned on and a sense current flows through programmable resistor 208 isolation transistor 280 to ground.

Figure 5:
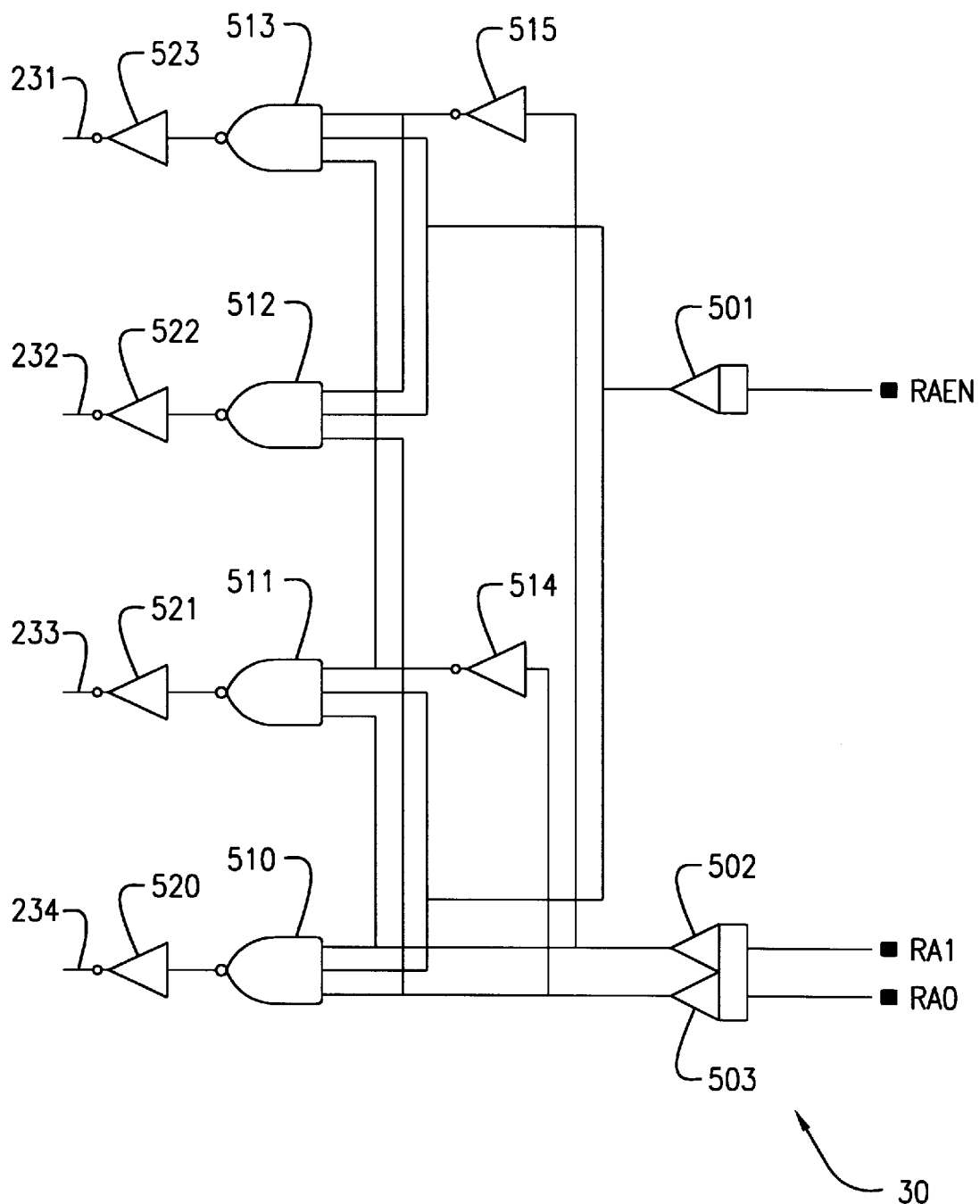
FIG. 5 is a detailed schematic of a row decoder in accordance with the present invention and included in the memory system of FIG. 2.

Row decoder circuit 30 is shown in greater detail in FIG. 5. The structure and operation of row decoder 30 is similar to that of column decoder 50 and, therefore, a detailed discussion of the row decoder 30 is unnecessary. Row decoder 30 receives row address enable signal and row address signals RA1 and RA0 through buffer circuits 501, 502 and 503, respectively. These buffer circuits correspond to column decoder buffer circuits 301, 302 and 303, respectively. The outputs of buffer circuits 501, 502 and 503 are selectively applied to inverters 514, 515 and NAND gates 510 to 513, as shown in FIG. 5. The outputs of NAND gates 510 to 513 are respectively inverted by inverters 520 to 523 and supplied to row decoder output lines 231 to 234, respectively. Like column decoder 50, row decoder 30 drives only one of its outputs high in response to a given row address.

Returning again to FIG. 2, a reference resistor 261 is connected to a second column input line 61 via pass transistor 271. The high voltage transfer inverter 255 drives the gate of pass transistor 271 in response to an output from column decoder 50. Reference resistor 261 is also coupled to a potential barrier device, e.g., diode 262, which, in turn, is coupled to transistor 263 and 264. Transistors 271, 263 and 264, and diode 262 are preferably provided so that comparable capacitive and resistive loads are experienced by current flowing through reference resistor 261 and one of the programmable resistors in array 40. For example, transistor 271 provides capacitance and resistance comparable to one of first pass transistors 272 to 275. Diode 262 and transistor 264 provide additional capacitance and resistance comparable to the memory cell diodes 210 in array 40. Further transistor 263 provides biasing and additional capacitance associated with one of transistors 212, 214, 215 and 216. In addition, reference resistor 261 preferably has a resistance value between the high and low resistance states that can be programmed into the programmable resistors of array 40.

Figure 6:
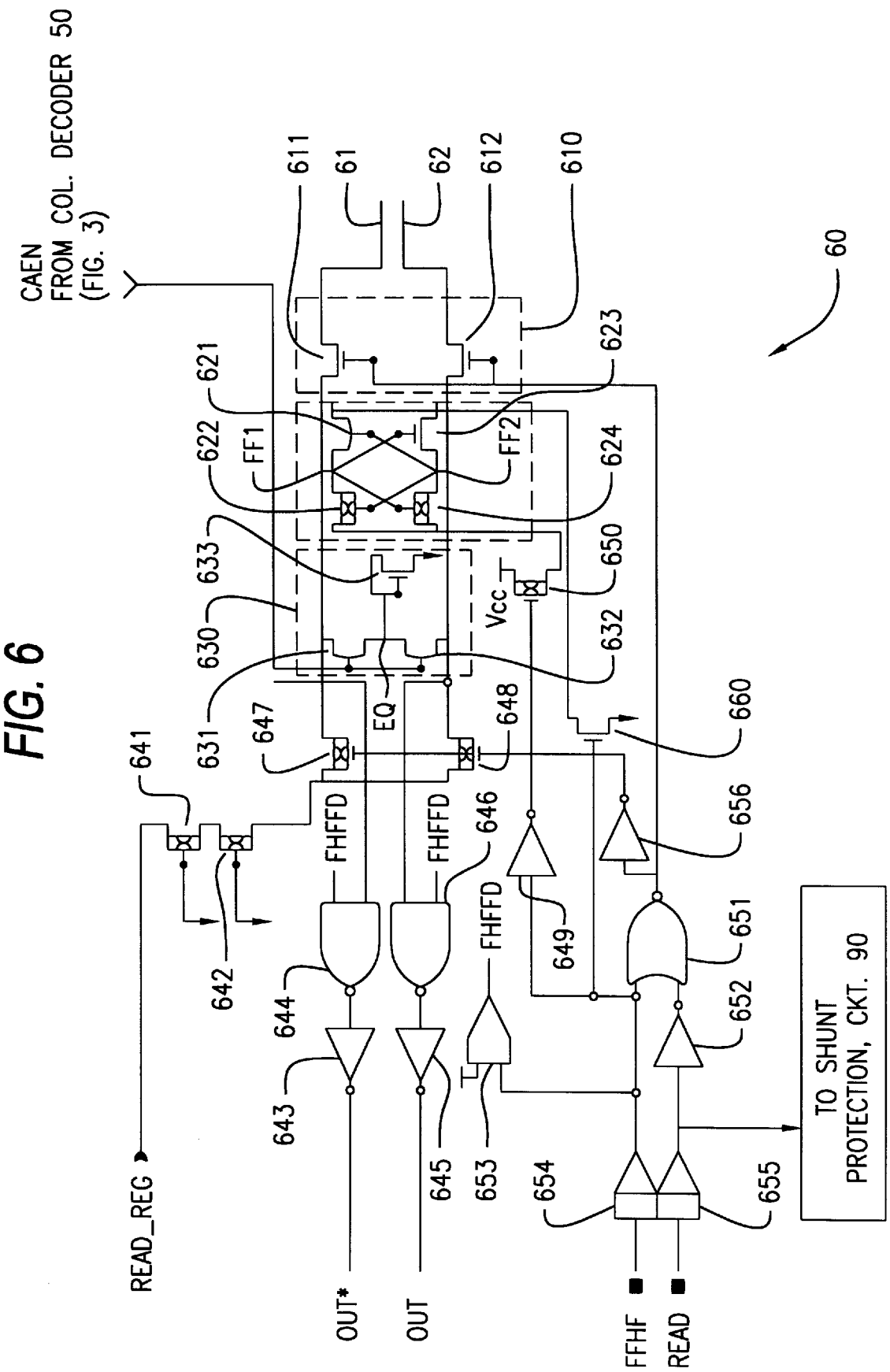
FIG. 6 is a detailed schematic of a comparison circuit in accordance with the present invention and included in the memory system of FIG. 2.

FIG. 6 illustrates read circuit 60 in greater detail. Read circuit 60 include an isolation circuit 610, helper flip-flop, cross-coupled latch or amplifier circuit 620 and precharge circuit 630. Isolation circuit 610 preferably includes transistors 612 and 611 having their drains respectively connected to first and second comparison input lines 62 and 61. The gates of these transistors are connected to the output of NOR gate 651 and the sources are respectively connected to flip-flop sense nodes FF2 and FF1.

Helper flip-flop circuit 620 preferably includes two cross-coupled CMOS inverters, i.e., n-channel MOS transistor 621 and p-channel MOS transistor 622 constituting one CMOS inverter, and n-channel MOS transistor 623 and p-channel MOS transistor 624 constituting the other CMOS inverter, for driving flip-flop sense nodes FF1 and FF2. The flip-flop sense nodes are further connected to a precharge circuit 630 including n-channel MOS transistors 631, 632 and 633. As shown in FIG. 6, transistors 631 and 632 are connected in series between nodes FF1 and FF2 and their gates are connected in common to the inverted CAEN output of column decoder 50. MOS transistor 633 is connected in a diode configuration and has its gate connected to its drain and to node EQ between transistors 631 and 632. Accordingly, when transistors 631 and 632 are turned on, the voltage at node EQ is set to one Vt above ground (0.6 V to 1 V), and, as discussed below, nodes FF1 and FF2 can be effectively equalized to this potential.

P-channel MOS transistors 647 and 648 respectively couple nodes FF1 and FF2 to regulated read potential READ_REG through current limiting MOS p-channel transistors 641 and 642. Nodes FF1 and FF2 are also connected to the inputs of NAND gates 644 and 646, respectively. NAND gates 644 and 646 also receive delayed fire helper flip-flop signal FHFFD from delay circuit 653, and output respectively to inverters 643 and 645, which, in turn, output to external circuitry.

As further shown in FIG. 6, fire helper flip-flop signal FHFF is supplied to a buffer circuit 654 and then supplied to a delay circuit 653. The output of buffer circuit 654 is also supplied to an input of NOR gate 651, to the gate of n-channel MOS transistor 660 and to inverter 649. The output of inverter 649 is connected to the gate of p-channel MOS transistor 650, which, when rendered conductive "fires" helper flip-flop 620 in conjunction with n-channel MOS transistor 660 by supplying a power supply potential Vcc to the source of p-channel transistors 622 and 624. Further, when n-channel transistor 660 is rendered conductive, it connects the sources of n-channel transistors 621 and 623 to ground.

A read signal READ is also supplied to read circuit 60. As seen in FIG. 6, read signal READ is supplied to buffer 655, the output of which is connected to shunt protection circuit 90 (to be discussed in detail below) and is inverted by inverter 652. The inverted READ signal is next supplied to an input of NOR gate 651, having its output connected to the gates of transistors 611 and 612 of isolation circuit 610 and to the input of inverter 656. The output of inverter 656 controls the gates of transistors 647 and 648.

A read operation of memory system 10 will now be described. By way of example, reading of data stored in a memory cell 206 will be discussed below with reference to FIGS. 2, and 6–9. Initially, at time t0 (see FIG. 7) the read circuit begins a precharge cycle when CAEN goes low and CAEN* goes high to turn on transistors 631 and 632, short nodes FF1 and FF2 together and to disconnect column lines 241–244 from comparison circuit input line 62. Signal FHFF also goes low, thereby turning off transistors 650 and 660. As a result, nodes FF1 and FF2 are precharged to approximately 1 V. READ also preferably goes low at t0 as well.

Figure 7:
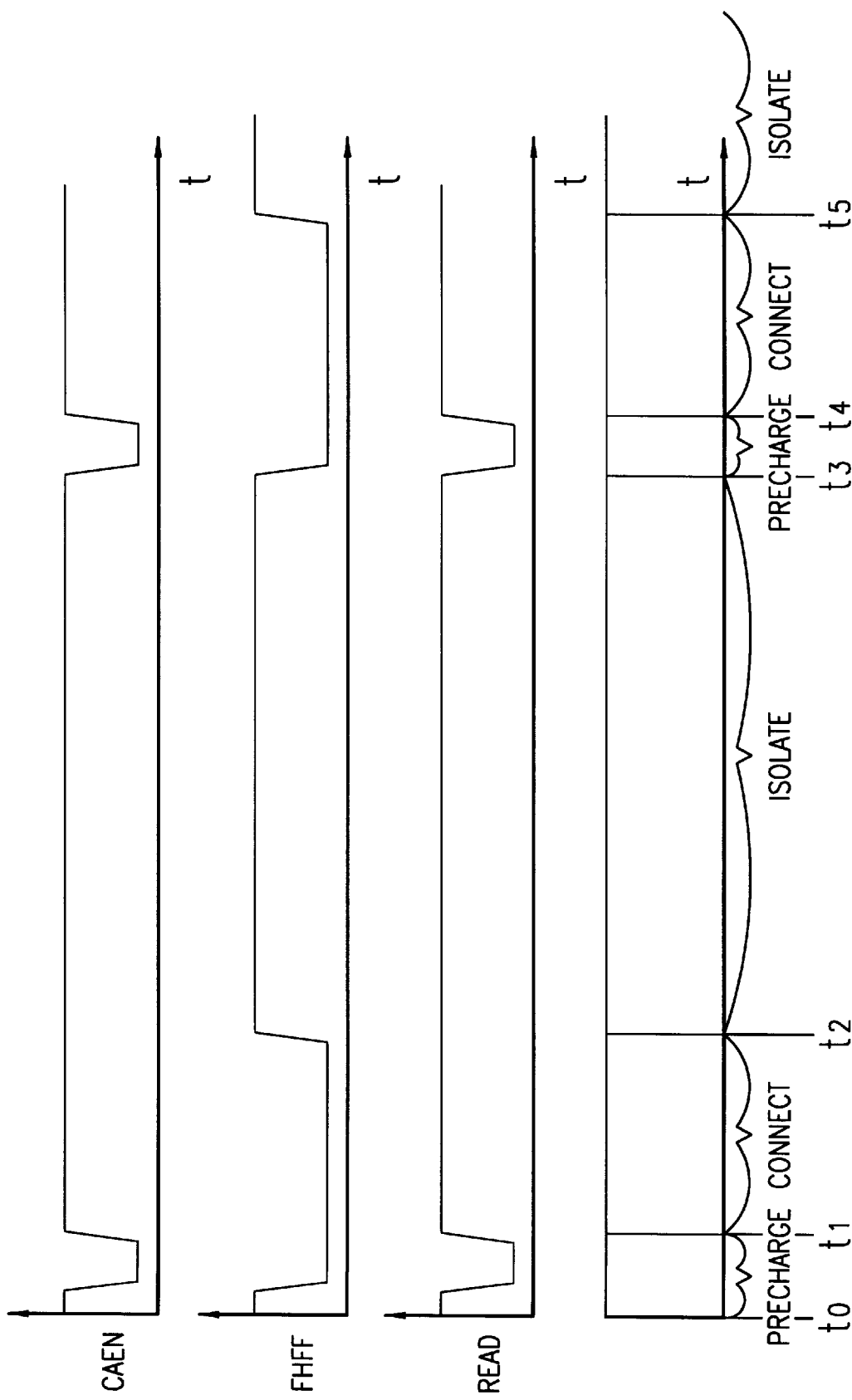
FIG. 7 illustrates voltage waveforms as a function of time of various signals supplied to the memory system in accordance with the present invention.
Figure 8:
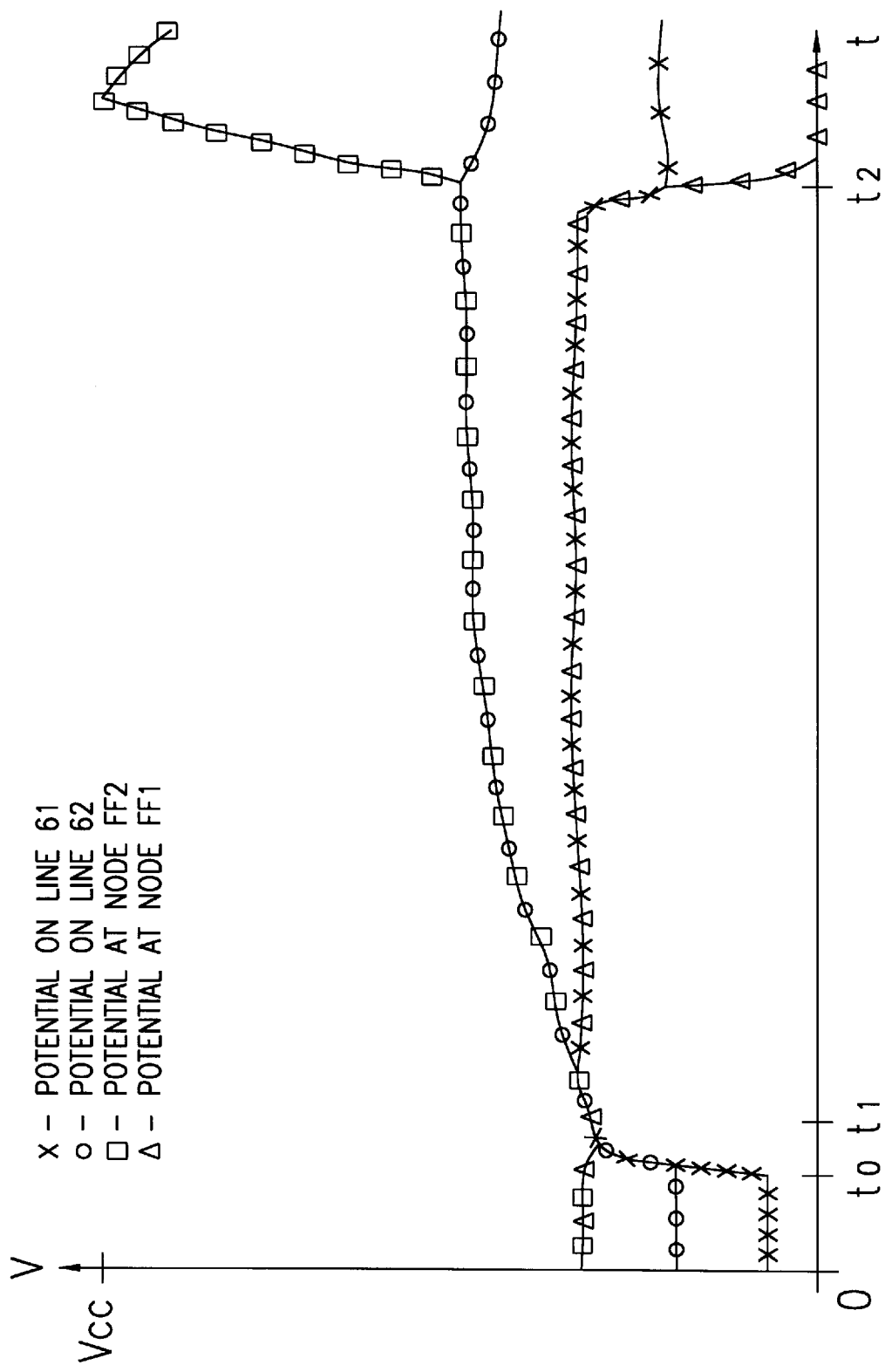
FIG. 8 illustrates voltage waveforms as a function of time at various nodes in the memory system in accordance with the present invention.

As seen in FIG. 7, at time t1, READ and CAEN go high. Since the inverse of READ and FHFF are NORed together, the output of NOR gate 651 goes high to turn on transistors 611 and 612 of isolation circuit 610. Accordingly, first and second comparison input lines 61 and 62 are connected to nodes FF1 and FF2, respectively, and remain connected until time t2, as indicated by the "CONNECT" interval labeled in FIG. 7. When the output of NOR 651 goes high, the output of inverter 656 accordingly goes low and connects the regulated read potential READ_REG to FF1 and FF2 through transistors 647 and 648, respectively. At the same time, CAEN* goes low, terminating the equilibrium of FF1 and FF2 through transistors 631 and 632. The voltage on comparison input lines 61 and 62 is therefore set to the precharge potential of nodes FF1 and FF2. At the same time, column address inputs CA0 and CA1 are set low so that column decoder output 251 goes high, and row address inputs RA0 and RA1 are set high so that row decoder output 234 goes high. Accordingly, first pass transistor 272 is rendered conductive to connect column line 241 to first comparison circuit input line 62. Column line 241 is thus selected, and second pass transistor 238 is rendered conductive to connect row line 205 to ground, thereby selecting row line 205. As a result, a sense current flows from the regulated read potential READ_REG through first comparison circuit input line 62, through column line 241, programmable resistor 208, diode 210, row line 205 and to ground via transistor 238. The sense current creates a potential drop across programmable resistor 208, which is observed as a sense voltage on first comparison circuit input line 62. Accordingly, if programmable resistor 208 is set to a high resistance (e.g., 10k ohm), the potential on comparison circuit input line 62 and node FF2 will start to rise, and, as shown in FIG. 8, will continue to rise gradually together between times t1 and t2.

Meanwhile, CAEN triggers a high output from driver 255 (see FIG. 2) to turn on transistor 271. Thus, a reference current flows from READ_REG through second comparison input line 61, through reference resistor 261 (preferably having a resistance of approximately 4k ohms), diode 262, transistor 264 and to ground. The reference current similarly creates a potential drop across the fixed resistance of reference resistor 261, which results in a reference voltage appearing at second comparison input line 61. As seen in FIG. 8, the potentials of both second comparison input line 61 and node FF1 preferably remain substantially constant over the "CONNECT" interval between times t1 and t2.

At time t2, however, FHFF goes high to turn on transistor 650 through inverter 649, and turn on transistor 660. Thus, the sources of helper flip-flop n-channel transistors 621 and 623 are coupled to ground and the sources of p-channel transistors 622 and 624 are connected to power supply Vcc. The helper flip-flop is thus, "fired" or powered up to drive nodes FF2 and FF1 to the power supply Vcc and ground, respectively (see FIG. 8). Simultaneously, a low potential is output from NOR gate 651 to cut off transistors 611 and 612 of isolation circuit 610 and isolate lines 61 and 62 from nodes FF1 and FF2, respectively, thereby leaving lines 61 and 62 connected only to their respective resistor circuits. This additional isolation step is performed because the high voltages appearing on nodes FF1 and FF2 could otherwise alter the resistance of programmable resistors in array 40. The low output from NOR 651 also causes inverter 656 to output a high potential, switching off transistors 647 and 648 and thereby isolating flip-flop 620 from the regulated read voltage READ_REG.

The potential at nodes FF1 and FF2 is supplied to the inputs of NAND gates 644 and 646, respectively. When delayed fire helper flip-flop FFHFD signal goes high, preferably about 2 ns after FFHF goes high, NAND gate 646 outputs a low potential, while NAND gate 644 outputs a relatively high potential. The NAND gate outputs are then inverted by inverters 645 and 643, respectively, to generate complementary outputs OUT and OUT*. In this example, OUT is high, at power supply Vcc, and OUT* is low, at ground, thereby indicating a high resistance or binary "1" stored in memory cell 206.

The read cycle can then repeat itself, as further shown in FIG. 7. Namely, at time t3, CAEN goes low to precharge nodes FF1 and FF2; at time t4, lines 61 and 62 are connected to nodes FF1 and FF2, respectively; and at time t5, lines 61 and 62 are isolated and data is output.

Figure 9:
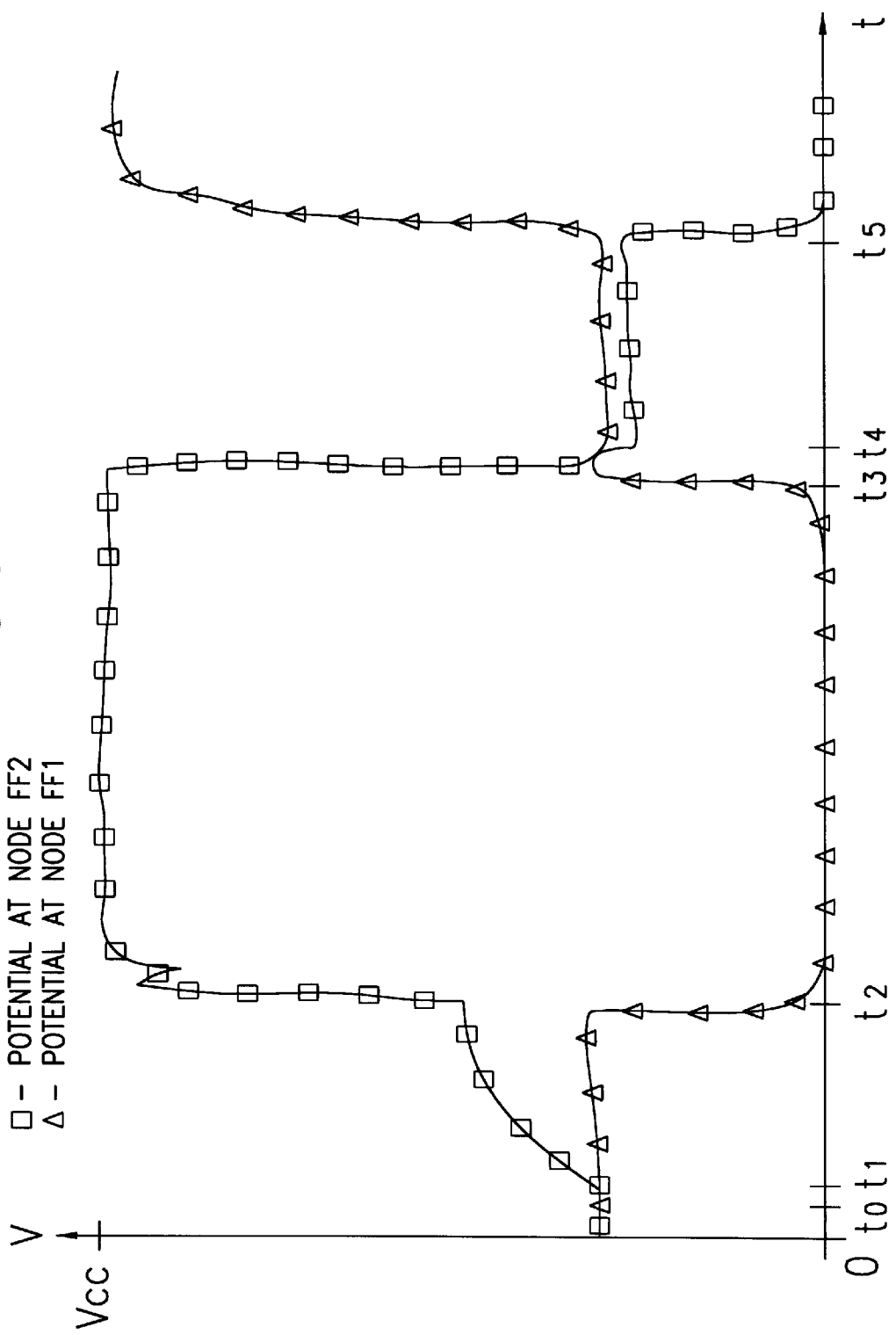
FIG. 9 illustrates voltage waveforms as a function of time at output nodes of the memory system in accordance with the present invention.

FIG. 9 shows potentials on nodes FF1 and FF2 during the read cycle starting at time t0 and ending at t3 and an additional read cycle starting at time t3 and extending through time t5. In the additional read cycle, however, a low resistance (e.g., 1k ohm) or binary "0" is stored in a memory cell in array 40. Thus, a relatively high sense current flows, resulting in a relatively low sense voltage which is slightly less than the reference voltage. Accordingly, when helper flip-flop 620 is powered up, node FF1 is driven to power supply Vcc and node FF2 is driven to ground. As noted above, however, if a high resistance is stored in the memory cell, the potential on node FF2 rises above the reference potential on node FF1 so that, upon firing helper flip-flop 620, node FF2 is set to power supply Vcc, while node FF1 goes to ground.

Write circuit 70 will now be described with reference to FIG. 10. Write circuit 70 receives a signal that initiates a write operation, START_WRT at node 1005, which is coupled to the input of buffer circuit 1011, the output of which is supplied to inverter 1012, which, in turn is connected to respective inputs of NOR gates 1019 and 1018. The output of inverter 1012 is also supplied to inverter 1013 having its output connected to reset and set delay circuits 1014 and 1015. NOR gates 1018 and 1019 also receive the outputs of RESET and SET delay circuits 1014 and 1015, respectively. NOR gates 1018 and 1019 further respectively receive signals SET_RESET* and its complement, buffered by circuit 1016. The outputs of NOR gates 1018 and 1019 are respectively supplied to inverters 1021 and 1020, which, in turn, output to corresponding high voltage driver inverters 1023 and 1022. Drivers 1022 and 1023 preferably have the same construction as driver circuits 255 and 320 to 323 associated with column decoder 50. The outputs of driver circuits 1022 and 1023 are connected to the gates of transistors 1025 and 1024, respectively. The drains of these devices are respectively connected to regulated voltages SET_REG and RESET_REG, and the sources are connected in common to access node 1026, which is connected to line 62 (see FIG. 2).

The operation of write circuit 70 will next be described with reference to FIG. 10. In order to program a binary "1" or a high resistance into one of the memory cells in array 40, a desired memory cell is selected by row and column decoders 30 and 50, as discussed above in regard to the read operation. Next, when START_WRT goes high and SET_RESET* remains low, an inverted START_WRT pulse is supplied to inputs of NOR gates 1018 and 1019. However, the rising edge of the START_WRT pulse is delayed by 40 ns by RESET DELAY circuit 1014. During this delay period, all three inputs to NOR gate 1018 are low, so that it outputs a relatively high voltage. The high voltage output is supplied to inverter 1021 and then to driver inverter 1023, which supplies a potential of at least one $V_T$ above power supply Vcc to the gate of transistor 1024. Accordingly, transistor 1024 passes RESET_REG (a regulated voltage of approximately 2.7 V) to access node 1026 and onto line 62, where it is routed to the selected memory cell and then to ground. The RESET_REG potential is supplied to the selected memory cell until the reset delay 1014 times out.

In order to program a binary "0" or low resistance, column and row decoders 30 and 50 select the desired memory cell. Signal START_WRT goes high while signal SET_RESET* is also high. Accordingly, the inverted START_WRT signal is supplied to the inputs NOR gates 1018 and 1019, but an inverted SET_RESET* signal is only applied to an input of NOR gate 1019. Meanwhile, the rising edge of the START_WRT pulse is delayed by 200 ns by set delay circuit 1015. During this delay, all three inputs to NOR gate 1019 are low so that it outputs a high voltage. This high voltage signal is inverted by inverter 1020 and inverted again by driver inverter 1022 to supply an elevated voltage to the gate of transistor 1025. Transistor 1025, however, remain on only for 200 ns, the amount of the delay set by delay circuit 1015. While transistor 1025 is on, it preferably supplies SET_REG (a regulated voltage of approximately 1.3 V) to access node 1026 and to line 62, where it is routed to ground via the selected memory cell.

Figure 10:
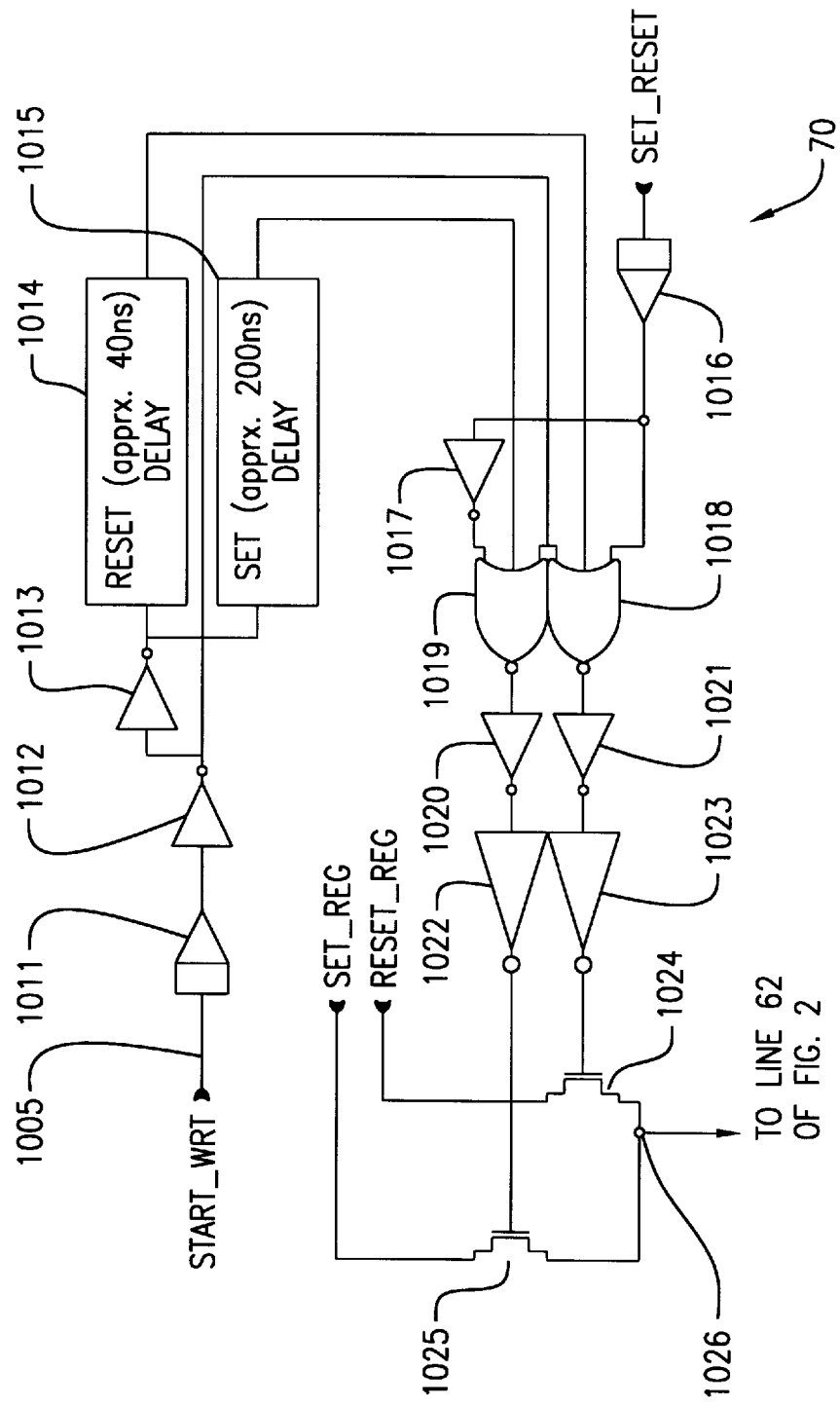
FIG. 10 is a detailed schematic of a write circuit in accordance with the present invention and included in the memory system of FIG. 2.
Figure 13:
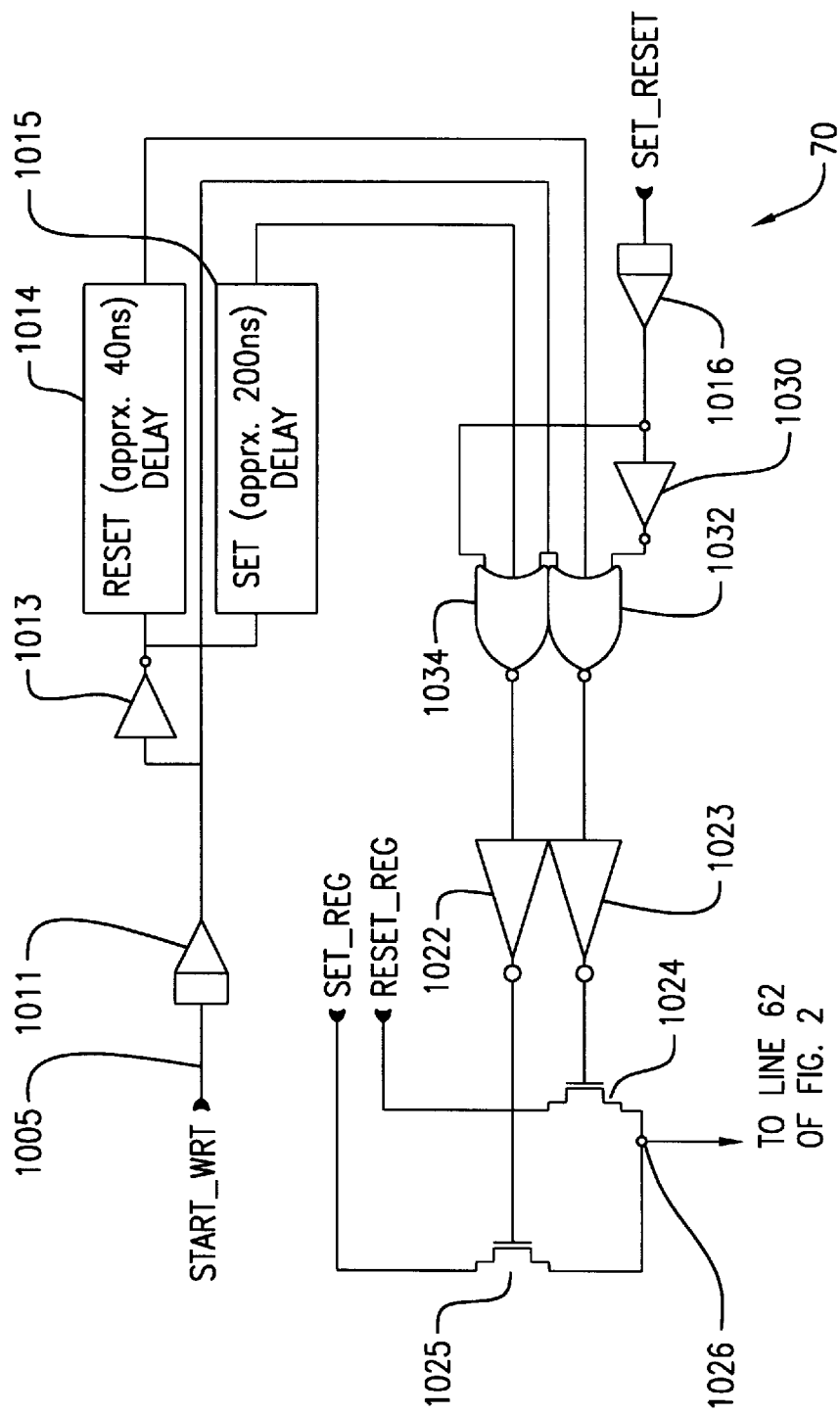
FIG. 13 illustrates a detailed schematic of an alternative write circuit in accordance with the present invention.

FIG. 13 illustrates an alternative write circuit 70' to the one shown in FIG. 10. Write circuit 70' has a similar configuration to write circuit 70 and generates the same outputs at the same timing as well. Write circuit 70', however, has three fewer inverters than write circuit 70, and, therefore, has a simpler construction. In particular, as further shown in FIG. 13, write circuit 70' omits inverter 1012 of write circuit 70. In addition, instead of NOR gates 1018 and 1019, write circuit 70' includes NAND gates 1032 and 1034, and inverter 1030 coupled to the input of NAND gate 1032. NAND gates 1032 and 1034 connect directly to drivers 1023 and 1022, respectively, thereby omitting inverters 1021 and 1020 of write circuit 70.

The operation of write circuit 70' will now be described in greater detail. In order to program a binary "1" or a high resistance into one of the memory cells in array 40, a desired memory cell is selected by row and column decoders 30 and 50, as discussed above. Next, SET_RESET* is set low, thereby pulling down the output of NAND gate 1034, but supplying a high input through inverter 1030 to NAND gate 1032. A high START_WRT pulse is supplied to the inputs of NAND gates 1032 and 1034. An inverted START_WRT pulse is also supplied to the input of NAND gate 1032, but it is delayed by circuit 1015 by 40 ns. During this delay, each input to NAND gate 1032 is high, so that it generates a low output. Inverting driver 1023 inverts the output of NAND gate 1032 and supplies an elevated high potential, as noted above, to the gate of transistor 1024, thereby turning it on to supply RESET_REG (a regulated voltage of approximately 2.7 V) to access node 1026 and onto line 62, where it is routed to the selected memory cell and then to ground. The RESET_REG potential is supplied to the selected memory cell until the reset delay 1014 times out.

In order to program a binary "0" or low resistance, column and row decoders 30 and 50 again select the desired memory cell. Signal START_WRT goes high while signal SET_RESET* is also high. Accordingly, the START_WRT signal is supplied to the inputs NAND gates 1032 and 1034, but an inverted SET_RESET* signal is only applied to an input of NAND gate 1032, keeping its output high. Meanwhile, the rising edge of the START_WRT pulse is delayed by 200 ns by set delay circuit 1015. During this delay, all three inputs to NAND gate 1034 are high so that it outputs a low voltage, which is inverted by driving inverter 1022 to supply an elevated voltage to the gate of transistor 1025. Transistor 1025, however, remains on only for 200 ns, the amount of the delay set by delay circuit 1015. While transistor 1025 is on, it preferably supplies SET_REG (a regulated voltage of about 1.3 V) to access node 1026 and to line 62, where it is routed to ground via the selected memory cell.

Returning to FIG. 2, a shunt protection circuit 90 in accordance with the present invention will next be described. Shunt protection circuit 90 is coupled to comparison circuit input lines 61 and 62 during read operations to protect the memory cells of array 40 from excessive currents flowing in comparison circuit input lines 61 and 62 and column lines 241 to 244. Shunt protection circuit 90 preferably includes MOS transistor 294 having its gate coupled to receive the READ signal from comparison circuit 60, its drain coupled to line 62 and its source is connected to ground through resistor 295 and diode 296. Shunt protection circuit 90 further includes MOS transistor 291, which also receives the READ signal at its gate, but has its drain connected to line 61 and its source connected to ground via resistor 292 and diode 293. It will be appreciated that, while a series combination of a resistor (292, 295) and a diode (293, 296) are shown connecting the transistor sources to ground, the grounding connection may be provided by only one circuit element, i.e., either a resistor or a diode.

As noted above, line 62 is connected to one of column lines 241 to 244 in response to column decoder 50 supplying a high output to a corresponding one of pass transistors 272–275. Simultaneously, driver 255 (see FIG. 2) drives the gate of transistor 271 in response to an additional output from column decoder 50 to connect line 61 to fixed resistor 261. Column decoder 50 maintains these outputs so long as CAEN is high. Thus, any spurious currents are likely to be supplied to the column lines and the fixed resistor during this period. Accordingly, a high READ signal is supplied to shunt transistors 291 and 294 when CAEN goes high during the read cycle to shunt any excess current through either one or both of diodes 293 and 296 and resistors 292 and 295, thereby limiting the voltage across and current through the selected programmable resistance element. Preferably, the voltage drop across diodes 293 and 296 and the resistance of resistors 292 and 295 are selected so that shunt circuit 90 sinks significant current only when the voltage appearing on lines 61 or 62 exceeds or approaches the write voltages output from write circuit 70.

It should be noted, however, that the high and low resistance values of the programmable resistors of array 40 and the resistance of the shunt resistor should be selected in order to balance sense margin with shunt protection. That is, while it is relatively easy to sense the difference between very high and very low resistances, any spurious current flowing through the high resistance, in particular, will cause a significant voltage drop which could reprogram the chalcogenide material. On the other hand, providing a shunt resistor in parallel with the programmable resistors creates effective resistances that can have a significantly narrow margin and may be more difficult to sense.

For example, if a 2k ohm shunt resistor is placed in parallel with 1k and 100k ohm programmable resistors, then the effective resistance associated with the 1k ohm resistor would be 0.66k ohm and the effective resistance associated with the 100k ohm resistor would be 1.96k ohm. Thus, while providing adequate over voltage protection, the margin in this case is significantly reduced because the comparison circuit must now sense the difference between 1.96k ohm and 0.66k ohm.

Thus, the signal to noise ratio anticipated for the system will determine, in large part, the resistances of the programmable resistors as well as the shunt resistors. In the above described embodiment, it will be assumed that a 0.6 V noise spike could be expected to occur across a 100k ohm programmable resistor in memory array 40 if no shunt protection is provided. This represents a 3.6 micro Watt disturbance, as follows:

$V^2/R = (0.6 \text{ V})^2/100k \text{ ohm} = 3.6 \text{ micro Watts}$

If a 10k ohm shunt resistor is connected as discussed above, the effective resistance associated with the programmable resistor in the 100k ohm state becomes 9.09k ohm. Assuming that a 3.6 micro Watt disturbance is now applied to a 9.09k ohm resistance, the resulting noise spike becomes 180 mV, as follows:

square root(3.6 micro Watts*9.09k ohm)=180 mV

Thus, the voltage associated with the noise is reduced significantly and well below the programming voltages discussed above. Accordingly, in the above described embodiment, the memory cells should be programmable to 1k and 100k ohm and the shunt resistor should have a resistance of 10k ohm.

Figure 11:
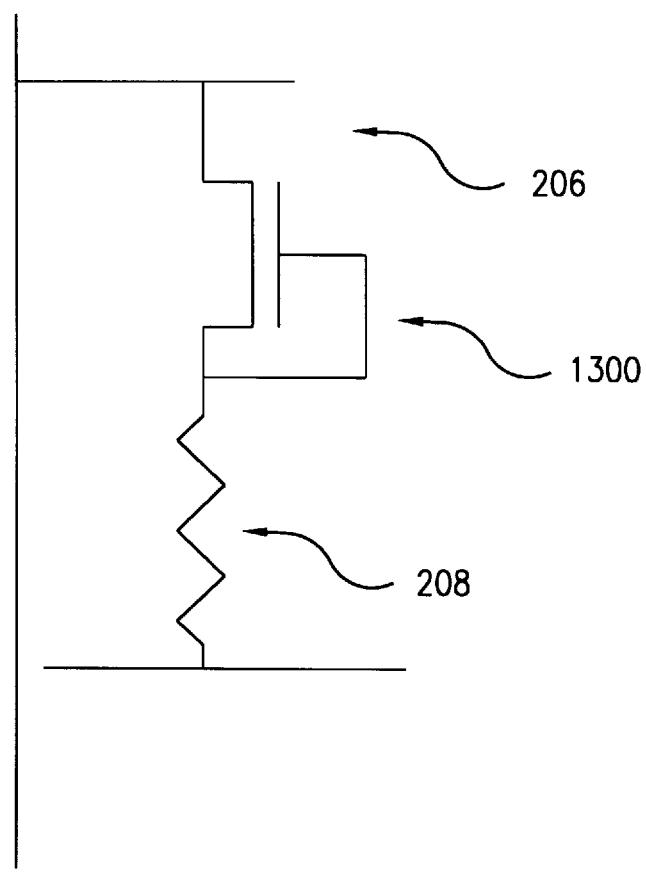
FIG. 11 is a detailed schematic of a programmable resistance element in accordance with yet a further embodiment of the present invention.

It will be apparent to those skilled in the art that various modifications and variations can be made in the memory system of the present invention and in construction of this memory system without departing from the scope or spirit of the invention. As an example, other memory cells including programmable resistors made of materials other than chalcogenide materials can be used. In addition, although voltage pulses having very sharp rise and fall times have been disclosed for programming the chalcogenide material, other pulses having varying fall times can be used for programming. Further, the present invention is not limited to chalcogenides have two stable resistance states. Rather, programmable resistors having more than two resistance states are contemplated with appropriate modifications to the read and write circuitry to retrieve and store the data. In addition, the memory cell may include a transistor 1300, instead of a diode, connected in series with the programmable resistor, as shown in FIG. 11. In which, case, the diode 262 connected to reference resistor 261 would also be replaced by a transistor in a similar fashion.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory system comprising:

an array of programmable resistance elements, each of which being programmable to one of a first resistance state and a second resistance state, wherein said programmable resistance elements are arranged in a plurality of columns and rows in said array;

a comparison circuit coupled to said array of programmable resistance elements, said comparison circuit adapted to compare sense signals developed by said programmable resistance elements and reference signals, and to generate read-out signals in response to said comparisons;

a plurality of column lines respectively coupled to pluralities of programmable resistance elements arranged in said columns:

a plurality of row lines respectively coupled to pluralities of programmable resistance elements arranged in said rows;

a column decoder circuit coupled to select one of said column lines; and a row decoder circuit coupled to select one of said row lines, thereby selecting one of said programmable resistance elements coupled to said selected column line and said selected row line.

2. A memory system in accordance with claim 1, wherein said column decoder has a plurality of outputs respectively corresponding to said plurality of column lines, one of said plurality of outputs operable to select said selected column line.

3. A memory system in accordance with claim 2, wherein said column decoder circuit further comprises:

a plurality of driver circuits respectively coupled to said plurality of outputs of said column decoder, one of said plurality of driver circuits coupled to said one output and generating a first potential signal operable to select said selected column line, remaining ones of said plurality of driver circuits receiving a second potential signal and supplying, in response thereto, a third potential signal to said remaining outputs of said column decoder, thereby deselecting said column lines other than said selected column line.

4. A memory system in accordance with claim 3, wherein a magnitude of said first potential signal being greater than a magnitude of said second potential signal.

5. A memory system in accordance with claim 3, wherein each said plurality of driver circuits includes an inverter circuit.

6. A memory system in accordance with claim 3, wherein each of said plurality of driver circuits respectively includes:

a n-channel MOS transistor having a source electrode for connection to a ground potential, a gate electrode for receiving an input signal, and a drain electrode coupled to said output node of said first driver circuit;

a first p-channel MOS transistor having a drain electrode coupled to said gate electrode of said n-channel transistor, a source electrode coupled to a supply potential, and a gate electrode coupled to said driver circuit output; and a second p-channel MOS transistor having a drain electrode coupled to a drain electrode of said n-channel MOS transistor, a source electrode coupled to said supply potential, and a gate electrode coupled to said drain electrode of said first p-channel MOS transistor, wherein said supply potential is greater than said magnitude of said second potential signal.

7. A memory system in accordance with claim 1, wherein said sense signals include sense voltages developed by directing a sense current through said programmable resistance elements and said reference signals include reference voltages derived from a reference current.

8. A memory system in accordance with claim 7, further comprising:
a first comparison circuit input line coupled to said selected one of said column lines, said sense current flowing through said first comparison circuit input line and through said selected one of said programmable resistance elements; and
a second comparison circuit input line for conducting said reference current.

9. A memory system in accordance with claim 8, wherein said comparison circuit comprises:
an amplifier circuit having first and second sense nodes respectively coupled to said first and second comparison input lines, respectively.

10. A memory system in accordance with claim 7, wherein said sense voltage and said reference voltage are generated on said first and second comparison circuit input lines, respectively, and
when said sense voltage is greater than said reference voltage, said amplifier circuit drives said first sense node to a voltage higher than said sense voltage and drives said second sense node to a voltage less than said reference voltage, and
when said sense voltage is less than said reference voltage, said amplifier circuit drives said first sense node to a voltage less than said sense voltage and drives said second sense node to a voltage higher than said reference voltage, said voltages on said first and second sense nodes are supplied to first and second output nodes of said amplifier, respectively.

11. A memory system in accordance with claim 9, further comprising:
an isolation circuit coupled to said first and second comparison circuit input lines,
wherein, in response to a control signal, said isolation circuit is rendered conductive to thereby connect said first and second sense nodes to said first and second comparison circuit input lines, respectively.

12. A memory system in accordance with claim 11, wherein said isolation circuit comprises:
a first switching element having a first terminal coupled to said first comparison circuit input line, a second terminal coupled to said first sense node, and a control terminal receiving said control signal; and
a second switching element having a first terminal coupled to said second comparison circuit input line, a second terminal coupled to said second sense node, and a control terminal receiving said control signal,
wherein, upon application of said control signal to said control terminals of said first and second switching elements, said first and second switching elements are rendered conductive to connect said first sense node to said first comparison circuit input line and said second sense node to said second comparisons circuit input line.

13. A memory system in accordance with 9, wherein said amplifier circuit includes a cross-coupled latch circuit.

14. A memory system in accordance with claim 13, wherein said cross-coupled latch circuit includes a flip-flop circuit.

15. A memory system in accordance with claim 9, further comprising:
a precharge circuit coupled between said first and second sense nodes of said amplifier circuit,
wherein upon application of a precharge signal to said precharge circuit, said first and second sense nodes are shorted together.

16. A memory system in accordance with claim 1, further comprising a write circuit coupled to said array of programmable resistance elements, said write circuit coupled to supply one of a first potential and a second potential to said array, said first potential and second potentials programming a selected programmable resistance element to said first and second resistance states, respectively.

17. A memory system in accordance with claim 1, wherein said programmable resistance elements are arranged in a plurality of columns and rows in said array, said memory system further comprising:
a plurality of column lines respectively coupled to pluralities of programmable resistance elements arranged in said columns;
a plurality of row lines respectively coupled to pluralities of programmable resistance elements arranged in said rows;
a column decoder circuit coupled to select one of said column lines at a time;
a row decoder circuit coupled to select one of said row lines at a time; and
a write circuit coupled to supply one of a first potential and a second potential to said array, said first potential and second potentials programming a programmable resistance element coupled to said selected row and column lines to said first and second resistance states, respectively.

18. A memory system in accordance with claim 16, wherein said first potential is supplied for a first duration to said selected programmable resistance element and said second potential is supplied for a second duration to said selected programmable resistance element.

19. A memory system in accordance with claim 18, wherein said write circuit further comprises:
a first switching element having a first terminal for receiving said first potential, a second terminal coupled to an access node, and a control terminal for receiving a first pulse of said first duration;
a second switching element having a first terminal for receiving said second potential, a second terminal coupled to said access node, and a control terminal for receiving a second pulse of said second duration,
wherein said access node is connected to said array of programmable resistance elements, and said write circuit selectively applies said first and second pulses to said control terminals of said first and second switching elements, respectively, in order to selectively supply said first and second potentials having said first and second durations, respectively, to said array of programmable resistance elements.

20. A memory system in accordance with claim 19, wherein said write circuit further comprises:
a first delay circuit for generating said first pulse; and
a second delay circuit for generating said second pulse.

21. A memory system in accordance with claim 19, wherein said write circuit further comprises:

a first driver circuit having an input node for receiving a first input pulse and an output node for supplying said first pulse to said control terminal of said first switching element, said first pulse having a voltage amplitude greater than said first input pulse; and a second driver circuit having an input node for receiving a second input pulse and an output node for supplying said second pulse to said control terminal of said second switching element, said second pulse having a voltage amplitude greater than said second input pulse.

22. A memory system in accordance with claim 21, wherein said first driver circuit includes:

a n-channel MOS transistor having a source electrode for connection to a ground potential, a gate electrode for receiving an inverted first input signal, and a drain electrode connected to said output node of said first driver circuit;

a first p-channel MOS transistor having a drain electrode coupled to said gate electrode of said n-channel transistor, a source electrode coupled to a supply potential, and a gate electrode coupled to said output node of said first driver circuit; and a second p-channel MOS transistor having a drain electrode coupled to a drain electrode of said n-channel MOS transistor, a source electrode coupled to said supply potential, and a gate electrode coupled to said drain electrode of said first p-channel MOS transistor, wherein a magnitude of said supply potential is greater than said voltage amplitude of said first input pulse.

23. A memory system in accordance with claim 19, wherein said first and second switching elements include MOS transistors.

24. A memory system in accordance with claim 1, wherein each of said programmable resistance elements in said array includes a chalcogenide material.

25. A memory system in accordance with claim 1, wherein each of said programmable resistance elements includes a programmable resistor.

26. A memory system in accordance with claim 25, wherein each of said programmable resistors has a first terminal and a second terminal, said first terminal is coupled to one of said column lines, each said programmable resistance elements further comprising:

a potential barrier device, said potential barrier device coupled between said second terminal of said programmable resistor and one of said row lines.

27. A memory system in accordance with claim 26, wherein said potential barrier device includes a transistor.

28. A memory system in accordance with claim 26, wherein said potential barrier device includes a diode.

29. A memory system in accordance with claim 26, further comprising:

a plurality of biasing circuits respectively coupled to each of said row lines, whereby, when said row lines are in a nonselected state, said plurality of biasing circuits supply a voltage to said nonselected word lines to reverse bias said potential barrier devices to a nonconductive condition.

30. A memory system in accordance with claim 8, further comprising a fixed resistance element coupled to said second comparison circuit input line, wherein said reference current flows through said fixed resistance element.

31. A memory system in accordance with claim 8, further comprising:

a first shunt protection circuit coupled to said first comparison circuit input line; and a second shunt protection circuit coupled to said second comparison circuit input line, said first and second shunt protection circuits limiting said sense and reference currents flowing through said first and second comparison circuit inputs lines, respectively.

32. A memory system in accordance with claim 31, wherein said first and second shunt protection circuits each include a diode.

33. A memory system in accordance with claim 31, wherein said first and second shunt protection circuits each include a resistor.

34. A memory system in accordance with claim 31, wherein said first and second shunt protection circuits each include a diode connected in series with a resistor.

35. A semiconductor memory device comprising:

a semiconductor substrate;

a matrix array of memory cells arranged in plural rows and columns on said substrate, each memory cell including a resistor programmable to one of a first resistance state and a second resistance state;

a plurality of column lines respectively coupled to the plural columns of memory cells;

a plurality of row lines respectively coupled to the plural rows of memory cells;

a column decoder circuit connected to select one of said column lines;

a row decoder circuit connected to select one of said row lines;

a column output line coupled to each of said column lines;

a reference line coupled to a fixed resistance element; and a comparator circuit coupled to said column output line and said reference line, said comparator circuit comparing a sense current flowing through said column output line and a selected programmable resistor coupled to said selected one of said row lines and a reference current flowing through said reference line and said fixed resistance element to thereby output a signal indicative of a resistance state of said programmable resistance element.

36. A semiconductor memory device in accordance with claim 35, wherein each of said programmable resistors includes a chalcogenide material.

37. A semiconductor memory device comprising:

a semiconductor substrate;

an array of programmable resistance elements formed on said substrate, each including a resistor programmable to one of a first resistance value and a second resistance value, said programmable resistance elements arranged in a plurality of rows and columns;

a plurality of column lines respectively coupled to pluralities of programmable resistance elements arranged in each of said columns;

a plurality of row lines respectively coupled to pluralities of programmable resistance elements arranged in each of said rows;

a column decoder circuit connected to select one of said column lines;

a row decoder circuit connected to select one of said row lines;

a column output line coupled to each of said column lines;

a write circuit coupled to said column output line to supply one of a first write voltage and a second write voltage to one of said programmable resistors coupled to said selected column line and said selected row line, said first write voltage programming said programmable resistor to said first resistance state and said second write voltage programming said programmable resistor to said second resistance state.

38. A semiconductor memory device comprising:
an array of programmable resistance elements, each including a resistor programmable to one of a first resistance value and a second resistance value, said programmable resistance elements arranged in a plurality of rows and columns;
a plurality of column lines respectively coupled to pluralities of programmable resistance elements arranged in each of said columns;
a column output line coupled to each of said column lines; and
a shunt protection circuit coupled to limit a current flowing through said column output line and said column lines.

39. A semiconductor memory device in accordance with claim 38, wherein said shunt protection circuit includes a diode.

40. A semiconductor memory device in accordance with claim 38, wherein said shunt protection circuit includes a resistor.

41. A semiconductor memory device in accordance with claim 38, wherein said shunt protection circuit includes a diode connected in series with a resistor.

42. A method of operating a memory, said memory including an array of programmable resistance elements, each programmable to one of a first resistance value and a second resistance value, said programmable resistance elements arranged in pluralities of rows and columns; a plurality of column lines respectively coupled to pluralities of programmable resistance elements arranged in said columns; a plurality of row lines respectively coupled to pluralities of programmable resistance elements arranged in said rows; a column decoder circuit connected to select one of said column lines; and a row decoder circuit connected to select one of said row lines, said method comprising the steps of:
driving one of said plurality of column lines to a first potential in accordance with an output of said column decoder;
driving one of said plurality of row lines to a second potential in accordance with an output of said row decoder;
directing a sense current though a programmable resistance element coupled to said one of said plurality of column lines and said one of said plurality of row lines; and
comparing said sense current with a reference current, to determine a programmed resistance of said programmable resistance element.

43. A method of operating a memory in accordance with claim 42, wherein said memory further includes a comparator circuit having first and second nodes, a first comparator input line coupled to each of said plurality of column lines and said comparator circuit, and a second comparator input line coupled to a fixed resistance element and said comparator circuit, said comparing step further comprising the steps of:
precharging said first and second nodes of said comparator circuit to a third potential;
connecting said first and second comparator input lines to said first and second comparator nodes, respectively;
driving said first comparison input line and said first comparison input node to a sense voltage proportional to said sense current; and
driving said second comparison input line and said second comparison input node to a reference voltage proportion to said reference current.

44. A method in accordance with claim 43, further comprising the steps of:
electrically isolating said first comparison input line from said first comparison node and said second comparison input line from said second comparison node;
driving said isolated first comparison node to a fourth voltage higher than said sense voltage and driving said isolated second comparison node to a fifth voltage less than said reference voltage when said sense voltage is higher than said reference voltage; driving said isolated first comparison node to said fifth voltage, and driving said isolated second comparison node to said fourth voltage when said sense voltage is less than said fifth voltage; and
outputting voltages appearing on said first and second comparison nodes.

45. A method in accordance with claim 42, further comprising the step of limiting a potential appearing on said column lines to not exceed a predetermined value.

46. A method of operating a memory, said memory including an array of programmable resistance elements, each programmable to one of a first resistance value and a second resistance value, said programmable resistance elements arranged in a plurality of columns; a plurality of column lines respectively coupled to pluralities of programmable resistance elements arranged in each of said columns, said method comprising the steps of:
supplying a current to one of said column lines; and
coupling a shunt circuit to said column lines to limit said current to not exceed a predetermined magnitude.

47. A memory system comprising:
an array of programmable resistance elements, each of which comprising a chalcogenide material and being programmable to one of a first resistance state and a second resistance state; and
a comparison circuit coupled to said array of programmable resistance elements, said comparison circuit adapted to compare sense signals developed by said programmable resistance elements and reference signals, and to generate readout signals in response to said comparisons.

48. A memory system in accordance with claim 47, wherein said programmable resistance elements are arranged in a plurality of columns and rows in said array, said memory system further comprising:
a plurality of column lines respectively coupled to pluralities of programmable resistance elements arranged in said columns;
a plurality of row lines respectively coupled to pluralities of programmable resistance elements arranged in said rows;
a column decoder circuit coupled to select one of said column lines; and
a row decoder circuit coupled to select one of said row lines, thereby selecting one of said programmable resistance elements coupled to said selected column line and said selected row line for coupling with said comparison circuit.

49. A memory system in accordance with claim 48, wherein said column decoder has a plurality of outputs respectively corresponding to said plurality of column lines, one of said plurality of outputs operable to select said selected column line.

50. A memory system in accordance with claim 49, wherein said column decoder circuit further comprises:

a plurality of driver circuits respectively coupled to said plurality of outputs of said column decoder, one of said plurality of driver circuits coupled to said one output and generating a first potential signal operable to select said selected column line, remaining ones of said plurality of driver circuits receiving a second potential signal and supplying, in response thereto, a third potential signal to said remaining outputs of said column decoder, thereby deselecting said column lines other than said selected column line.

51. A memory system in accordance with claim 50, wherein a magnitude of said first potential signal being greater than a magnitude of said second potential signal.

52. A memory system in accordance with claim 50, wherein each of said plurality of driver circuits includes an inverter circuit.

53. A memory system in accordance with claim 50, wherein each of said plurality of driver circuits respectively includes:

a n-channel MOS transistor having a source electrode for connection to a ground potential, a gate electrode for receiving an input signal, and a drain electrode connected to said output node of said first driver circuit;

a first p-channel MOS transistor having a drain electrode coupled to said gate electrode of said n-channel transistor, a source electrode coupled to a supply potential, and a gate electrode coupled to said driver circuit output; and a second p-channel MOS transistor having a drain electrode coupled to a drain electrode of said n-channel MOS transistor, a source electrode coupled to said supply potential, and a gate electrode coupled to said drain electrode of said first p-channel MOS transistor, wherein said supply potential is greater than said magnitude of said second potential signal.

54. A memory system in accordance with claim 48, wherein said sense signals include a sense voltage developed by supplying a sense current through said programmable resistance elements and said reference signals include a reference voltage derived from a reference current.

55. A memory system in accordance with claim 54, further comprising:

a first comparison circuit input line coupled to said selected one of said column lines, said sense current flowing through said first comparison circuit input line and through said selected one of said programmable resistance element; and a second comparison circuit input line for conducting said reference current.

56. A memory system in accordance with claim 55, wherein said comparison circuit comprises:

an amplifier circuit having first and second sense nodes respectively coupled to said first and second comparison input lines, respectively.

57. A memory system in accordance with claim 56, wherein said reference voltage and said sense voltage are generated on said first and second comparison circuit input lines, respectively, and when said sense voltage is greater than said reference voltage, said amplifier circuit drives said first sense node to a voltage higher than said sense voltage and drives said second sense node to a voltage less than said reference voltage, and when said sense voltage is less than said reference voltage, said amplifier circuit drives said first sense node to a voltage less than said sense voltage and drives said second sense node to a voltage higher than said reference voltage, said voltages on said first and second sense nodes are supplied to first and second output nodes of said amplifier, respectively.

58. A memory system in accordance with claim 56, further comprising:

an isolation circuit coupled to said first and second comparison circuit input lines, wherein, in response to a control signal, said isolation circuit is rendered conductive to thereby connect said first and second sense nodes to said first and second comparison circuit input lines, respectively.

59. A memory system in accordance with claim 58, wherein said isolation circuit comprises:

a first switching element having a first terminal coupled to said first comparison circuit input line, a second terminal coupled to said first sense node, and a control terminal receiving said control signal; and a second switching element having a first terminal coupled to said second comparison circuit input line, a second terminal coupled to said second sense node, and a control terminal receiving said control signal, wherein, upon application of said control signal to said control terminals of said first and second switching elements, said first and second switching elements are rendered conductive to connect said first sense node to said first comparison circuit input line and said second sense node to said second comparisons circuit input line.

60. A memory system in accordance with 56, wherein said amplifier circuit includes a cross-coupled latch circuit.

61. A memory system in accordance with claim 60, wherein said dross-coupled latch circuit includes a flip-flop circuit.

62. A memory system in accordance with claim 56, further comprising:

a precharge circuit coupled between said first and second sense nodes of said amplifier circuit, wherein upon application of a precharge signal to said precharge circuit, said first and second sense nodes are shorted together.

63. A memory system in accordance with claim 47, further comprising a write circuit coupled to supply one of a first write signal and a second write signal to said array for programming a selected programmable resistance element to said first and second resistance states, respectively.

64. A memory system in accordance with claim 47, wherein said programmable resistance elements are arranged in a plurality of columns and rows in said array, said memory system further comprising:

a plurality of column lines respectively coupled to pluralities of programmable resistance elements arranged in said columns;

a plurality of row lines respectively coupled to pluralities of programmable resistance elements arranged in said rows;

a column decoder circuit connected to select one of said column lines at a time;

a row decoder circuit connected to select one of said row lines at a time; and a write circuit coupled to supply one of first and second write signals to program a selected programmable resistance element coupled to said selected row and column lines to either of said first and second resistance states, respectively.

65. A memory system in accordance with claim 63, wherein said first potential is supplied to said selected programmable resistance element for a first duration, and said second potential is supplied for a second duration to said selected programmable resistance element.

66. A memory system in accordance with claim 65, wherein said write circuit further comprises:
   a first switching element having a first terminal for receiving said first potential, a second terminal coupled to an access node, and a control terminal for receiving a first pulse of said first duration;
   a second switching element having a first terminal for receiving said second potential, a second terminal coupled to said access node, and a control terminal for receiving a second pulse of said second duration,
   wherein said access node is connected to said array of programmable resistance elements, and said write circuit selectively applying said first and second pulses to said control terminals of said first and second switching elements, respectively, to selectively supply said first and second potentials having said first and second durations, respectively, to said array of programmable resistance elements.

67. A memory system in accordance with claim 66, wherein said write circuit further comprises:
   a first delay circuit for generating said first pulse; and
   a second delay circuit for generating said second pulse.

68. A memory system in accordance with claim 66, wherein said write circuit further comprises:
   a first driver circuit having an input node for receiving a first input pulse and an output node for supplying said first pulse to said control terminal of said first switching element, said first pulse having a voltage amplitude greater than said first input pulse; and
   a second driver circuit having an input node for receiving a second input pulse and an output node for supplying said second pulse to said control terminal of said second switching element, said second pulse having a voltage amplitude greater than said second input pulse.

69. A memory system in accordance with claim 68, wherein said first driver circuit includes:
   a n-channel MOS transistor having a source electrode for connection to a ground potential, a gate electrode for receiving an inverted first input signal, and a drain electrode connected to said output node of said first driver circuit;
   a first p-channel MOS transistor having a drain electrode coupled to said gate electrode of said n-channel transistor, a source electrode coupled to a supply potential, and a gate electrode coupled to said output node of said first driver circuit; and
   a second p-channel MOS transistor having a drain electrode coupled to a drain electrode of said n-channel MOS transistor, a source electrode coupled to said supply potential, and a gate electrode coupled to said drain electrode of said first p-channel MOS transistor,
   wherein a magnitude of said supply potential is greater than said voltage amplitude of said first input pulse.

70. A memory system in accordance with claim 66, wherein said first and second switching elements include MOS transistors.

71. A memory system in accordance with claim 48, wherein each of said programmable resistance elements includes a programmable resistor.

72. A memory system in accordance with claim 71, wherein each of said programmable resistors has a first terminal and a second terminal, said first terminal is coupled to one of said column lines, each said programmable resistance elements further comprising:
   a potential barrier device, said potential barrier device coupled between said second terminal of said programmable resistor and one of said row lines.

73. A memory system in accordance with claim 72, wherein said potential barrier device includes a transistor.

74. A memory system in accordance with claim 72, wherein said potential barrier device includes a diode.

75. A memory system in accordance with claim 72, further comprising:
   a plurality of biasing circuits respectively coupled to each of said row lines, whereby, when said row lines are in a nonselected state, said plurality of biasing circuits supply a voltage to said nonselected word lines to reverse bias said potential barrier devices to a nonconductive condition.

76. A memory system in accordance with claim 55, further comprising a fixed resistance element coupled to said second comparison circuit input line,
   wherein said reference current flows through said fixed resistance element.

77. A memory system in accordance with claim 55, further comprising:
   a first shunt protection circuit coupled to said first comparison circuit input line; and
   a second shunt protection circuit coupled to said second comparison circuit input line, said first and second shunt protection circuits limiting said sense and reference currents flowing through said first and second comparison circuit inputs lines, respectively.

78. A memory system in accordance with claim 77, wherein said first and second shunt protection circuits each include a diode.

79. A memory system in accordance with claim 77, wherein said first and second shunt protection circuits each include a resistor.

80. A memory system in accordance with claim 77, wherein said first and second shunt protection circuits each include a diode connected in series with a resistor.

81. A semiconductor memory device comprising:
   an array of programmable resistance elements, each including a resistor comprising chalcogenide material and being programmable to one of a first resistance value and a second resistance value, said programmable resistance elements arranged in a plurality of rows and columns;
   a plurality of column lines respectively coupled to pluralities of programmable resistance elements arranged in each of said columns;
   a column output line coupled each of said column lines; and
   a shunt protection circuit limiting a current flowing through said column output line and said column lines.

82. A semiconductor memory device in accordance with claim 81, wherein said shunt protection circuit includes a diode.

83. A semiconductor memory device in accordance with claim 81, wherein said shunt protection circuit includes a resistor.

84. A semiconductor memory device in accordance with claim 81, wherein said shunt protection circuit includes a diode connected in series with a resistor.

85. A memory system in accordance with one of claims 6, 22 or 53, wherein said n-channel transistor is a first n-channel transistor, said memory system further comprising:
- a second n-channel transistor connected between said drain of said first p-channel transistor and said gate of said first n-channel transistor.

86. A memory system in accordance with claim 8 or 55, further comprising:
- a first shunt protection circuit coupled to said first comparison circuit input line; and
- a second shunt protection circuit coupled to said second comparison circuit input line, said first and second shunt protection circuits limiting voltages appearing on said first and second comparison circuit input lines.

87. A semiconductor memory device comprising:
- an array of programmable resistance elements, each including a resistor programmable to one of a first resistance value and a second resistance value, said programmable resistance elements arranged in a plurality of rows and columns;
- a plurality of column lines respectively coupled to pluralities of programmable resistance elements arranged in each of said columns;
- a column output line coupled to each of said column lines; and
- a shunt protection circuit coupled to limit voltages appearing on said column output line and said column lines.

88. A semiconductor memory device in accordance with claim 87, wherein said shunt protection circuit includes a diode.

89. A semiconductor memory device in accordance with claim 87, wherein said shunt protection circuit includes a resistor.

90. A semiconductor memory device in accordance with claim 87, wherein said shunt protection circuit includes a diode connected in series with a resistor.

91. A semiconductor memory device in accordance with claim 87, wherein each said programmable resistors include a chalcogenide material.

92. A method of operating a memory, said memory including an array of programmable resistance elements, each programmable to one of a first resistance value and a second resistance value, said programmable resistance elements arranged in a plurality of columns; a plurality of column lines respectively coupled to pluralities of programmable resistance elements arranged in each of said columns, said method comprising the steps of:
- supplying a current to one of said column lines; and
- coupling a shunt circuit to said column lines to limit a voltage on said one of said column lines to not exceed a predetermined magnitude.

* * * * *

UNITED STATES PATENT AND TRADEMARK OFFICE
CERTIFICATE OF CORRECTION

| | |
|---|---|
| PATENT NO. | : 5,883,827 |
| DATED | : March 16, 1999 |
| INVENTOR(S) | : Donald M. Morgan |

Page 1 of 1

It is certified that error appears in the above-identified patent and that said Letters Patent is hereby corrected as shown below:

<u>Title page,</u>
--(*) Notice: GOVERNMENT RIGHTS
This invention was made with United States Government support under contract No. DABT63-97-C-0001 awarded by the Advance Research Projects Agency (ARPA). The United States Government has certain rights in this invention. --

Signed and Sealed this

Twenty-fifth Day of September, 2001

*Attest:*

*Attesting Officer*

NICHOLAS P. GODICI
*Acting Director of the United States Patent and Trademark Office*